(12) United States Patent
Choi et al.

(10) Patent No.: US 12,457,856 B2
(45) Date of Patent: Oct. 28, 2025

(54) LIGHT EMITTING DISPLAY DEVICE

(71) Applicant: Samsung Display Co., Ltd., Yongin-Si (KR)

(72) Inventors: Nak Cho Choi, Yongin-si (KR); Taek Geun Lee, Cheonan-si (KR); Kwang Sik Lee, Cheonan-si (KR); Yun-Kyeong In, Hwaseong-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 722 days.

(21) Appl. No.: 17/573,345

(22) Filed: Jan. 11, 2022

(65) Prior Publication Data

US 2022/0415979 A1    Dec. 29, 2022

(30) Foreign Application Priority Data

Jun. 25, 2021    (KR) .................. 10-2021-0083448

(51) Int. Cl.
*H10K 59/122*    (2023.01)
*H10K 50/86*    (2023.01)
(Continued)

(52) U.S. Cl.
CPC ......... *H10K 59/122* (2023.02); *H10K 50/865* (2023.02); *H10K 59/38* (2023.02); *H10K 59/8723* (2023.02); *H10K 59/8792* (2023.02)

(58) Field of Classification Search
CPC ... H10K 50/00–87; H10K 59/80–8794; H10K 59/00–88; H10K 70/00; H10K 71/00–441; H10K 71/831–861; H10K 30/865; H10K 2101/00–80; H10K 85/00–761; H10K 77/10; H10K 77/111; H10K 2102/301; H10K 2102/341; H10K 2102/30; H10K 2102/361; H10K 2102/311; H10K 59/122; H10K 50/865; H10K 59/38; H10K 59/8723; H10K 59/8792;
(Continued)

(56) References Cited

U.S. PATENT DOCUMENTS

| 10,020,351 B2 | 7/2018 | Yang et al. |
| 10,367,045 B2 | 7/2019 | Yang et al. |

(Continued)

FOREIGN PATENT DOCUMENTS

| CN | 106449726 A | 2/2017 |
| EP | 3806156 A1 | 4/2021 |

(Continued)

*Primary Examiner* — David Vu
(74) *Attorney, Agent, or Firm* — Innovation Counsel LLP

(57) ABSTRACT

The present disclosure relates to a light emitting display device including: a substrate; an anode positioned on the substrate; a black pixel defining layer, wherein an opening overlapping an anode is defined in the black pixel defining layer; an emission layer positioned in the opening of the black pixel defining layer; a spacer positioned on the black pixel defining layer and having a step; and a cathode formed on the emission layer, the black pixel defining layer, and the spacer, wherein the spacer has a first portion and a second portion having a lower height than the first portion and integrally formed with the first portion, and the end portion of the second portion is positioned closer to the opening than the end portion of the first portion.

7 Claims, 28 Drawing Sheets

(51) Int. Cl.
*H10K 59/38* (2023.01)
*H10K 59/80* (2023.01)

(58) Field of Classification Search
CPC .. H10K 59/173; H10K 50/844; H10K 59/123; H10K 59/131; H10K 50/8426; B32B 2457/206; H05B 33/02; H05B 33/04; H05B 33/06; H05B 33/10; H05B 33/22
See application file for complete search history.

(56) References Cited

U.S. PATENT DOCUMENTS

| | | | |
|---|---|---|---|
| 2017/0373124 A1* | 12/2017 | Yang | .................... H10K 59/879 |
| 2021/0359047 A1 | 11/2021 | Yoon et al. | |
| 2021/0367008 A1 | 11/2021 | Hu et al. | |
| 2022/0093708 A1 | 3/2022 | Cho et al. | |
| 2022/0130915 A1 | 4/2022 | Son et al. | |
| 2022/0223667 A1 | 7/2022 | Choi et al. | |
| 2022/0246689 A1 | 8/2022 | Choi | |
| 2023/0345772 A1* | 10/2023 | Wei | ..................... H10K 59/124 |

FOREIGN PATENT DOCUMENTS

| | | | |
|---|---|---|---|
| KR | 10-2016-0142810 A | | 12/2016 |
| KR | 10-2018-0000975 A | | 1/2018 |
| KR | 20190095630 A | * | 8/2019 |
| KR | 10-2021-0016230 A | | 2/2021 |
| KR | 10-2021-0142808 A | | 11/2021 |
| KR | 10-2022-0041286 A | | 4/2022 |
| KR | 10-2022-0053756 A | | 5/2022 |
| KR | 10-2022-0102194 A | | 7/2022 |
| KR | 10-2022-0111810 A | | 8/2022 |
| WO | 2021-025234 A1 | | 2/2021 |

* cited by examiner

FIG. 19

| | BPDL01 | PSP1 | BPDL02 | BPDL03 |
|---|---|---|---|---|
| Test After | | | | |
| Test Before | | | | |

LIGHT EMITTING DISPLAY DEVICE

CROSS-REFERENCE TO RELATED APPLICATION(S)

This application claims priority to and the benefit of Korean Patent Application No. 10-2021-0083448 filed in the Korean Intellectual Property Office (KIPO) on Jun. 25, 2021, the entire contents of which are incorporated herein by reference.

BACKGROUND

1. Field

The present disclosure relates to a light emitting display device, and more particularly, to a light emitting display device that reduces reflectance of external light without using a polarizer.

2. Description of the Related Art

A display device is a device that displays a screen, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

The display device such as the organic light emitting diode display may have a structure in which it may be bent or folded using a flexible substrate.

In addition, in the small electronic devices such as portable phones, optical elements such as cameras and optical sensors are formed in the bezel area around the display area, however as the size of the peripheral area of the display area is gradually reduced while the size of the screen to be displayed is increased, a technology is being developed that allows the camera or the optical sensor to be positioned on the back of the display area.

The above information disclosed in this Background section is only for enhancement of understanding of the background of the described technology, and therefore it may contain information that does not form the prior art that is already known in this country to a person of ordinary skill in the art.

SUMMARY

Embodiments are for lowering reflectance of external light, increasing scratch strength, or improving interlayer adherence.

A light emitting display device according to an embodiment includes: a substrate; an anode positioned on the substrate; a black pixel defining layer, wherein an opening overlapping an anode is defined in the black pixel defining layer; an emission layer positioned in the opening of the black pixel defining layer; a spacer positioned on the black pixel defining layer and having a step; and a cathode formed on the emission layer, the black pixel defining layer, and the spacer, wherein the spacer has a first portion and a second portion having a lower height than the first portion and integrally formed with the first portion, and one of end portions of the second portion is positioned closer to the opening than one of end portions of the first portion.

The second portion may be positioned away from the opening of the black pixel defining layer by a predetermined distance.

A planar area ratio of the black pixel defining layer covered by the spacer may be 50% or more and 95% or less.

The spacer may be formed of a photosensitive polyimide (PSPI) or a positive type photosensitive organic material, and the black pixel defining layer may include a light blocking material and be formed of an organic material having a negative type of black color.

A height of the first portion may be 1.1 μm or more and 2.0 μm or less, and a height of the second portion may be 0.1 μm or more and 0.5 μm or less.

The light emitting display device may further include: an encapsulation layer positioned on the cathode; a detecting insulating layer and a detecting electrode positioned on the encapsulation layer; and a light blocking layer and a color filter positioned on the detecting insulating layer and the detecting electrode.

The light emitting display device may further include a functional layer disposed under the cathode and positioned on the black pixel defining layer, the emission layer, and the spacer, the functional layer may includes a hole injection layer, and the hole injection layer may be in contact with the black pixel defining layer and the spacer.

A light emitting display device according to an embodiment includes a main display area and a component area, wherein the component area includes: a unit pixel including a plurality of light emitting diodes (LEDs); a component spacer positioned on the periphery of the plurality of light emitting diodes (LEDs) included in the unit pixel; and a light transmission area positioned on the periphery of the unit pixel, and the component spacer includes a first component spacer positioned outside the unit pixel and a second component spacer positioned between the plurality of light emitting diodes (LEDs) included in the unit pixel, and the second component spacer has a lower height than the first component spacer, and the second component spacer and the first component spacer are spaced apart from each other.

The unit pixel may further include a black pixel defining layer having a plurality of openings, and a plurality of openings of the black pixel defining layer may correspond one-to-one to a plurality of light emitting diodes (LEDs) included in the unit pixel.

Four of the first component spacers may be formed outside the unit pixel, and when four first component spacers are connected, a rhombus structure may be formed on a plane.

The second component spacer may be positioned in a rectangular area formed by the plurality of light emitting diodes (LEDs) and be formed crossing between a plurality of openings of the black pixel defining layer.

The second component spacer may be spaced apart from a plurality of openings of the black pixel defining layer by a predetermined distance on a plane.

The second component spacer may not be positioned in a part between a plurality of openings adjacent to the black pixel defining layer.

The second component spacer may have a protruded structure from right to left in addition to an H-shape.

An edge positioned at the outermost side of the unit pixel among a plurality of openings of the black pixel defining layer and an edge of the second component spacer adjacent to the edge may have a distance of about 5 μm from each other.

A boundary portion spacer may be further formed on the boundary area positioned between the main display area and the component area, and the boundary portion spacer may include a second boundary portion spacer having a constant height and having a tapered structure at one end on a boundary with the light transmission area.

The height of the second boundary portion spacer may be 0.1 μm or more and 0.5 μm or less.

The spacer and the boundary portion spacer may be formed of a photosensitive polyimide (PSPI) or a positive type of photosensitive organic material, and the black pixel defining layer may include a light blocking material and be formed of an organic material with a negative type of black color.

An opening of the black pixel defining layer may be positioned in the main display area, the main spacer may be positioned in the periphery of the opening in the main display area, the main spacer may include a first portion and a second portion having a lower height than the first portion and integrally formed with the first portion, and the second portion may be positioned close to the opening in the main display area.

The planar area ratio of the black pixel defining layer covered by the main spacer may be 50% or more and 95% or less.

According to embodiments, a ratio at which the external light is reflected may be reduced by using the black pixel defining layer for a pixel definition layer that separates the emission layers from each other instead of a polarizer. By forming the spacer with the step on the black pixel defining layer that separates the emission layers from each other, it is possible to increase the search strength and reduce an occurrence rate of dark spot defects according to pressing pressure. On the other hand, by forming the spacer having the step on the black pixel defining layer that separates the emission layers from each other, adherence with the functional layer positioned on the black pixel defining layer and the spacer may be improved, thereby improving dark spot defects according to the pressure or preventing moisture and air from being penetrating from the outside.

BRIEF DESCRIPTION OF THE DRAWINGS

FIG. 18 and FIG. 19 are views showing a method of testing adherence and a result thereof.

DETAILED DESCRIPTION

Figure 1:
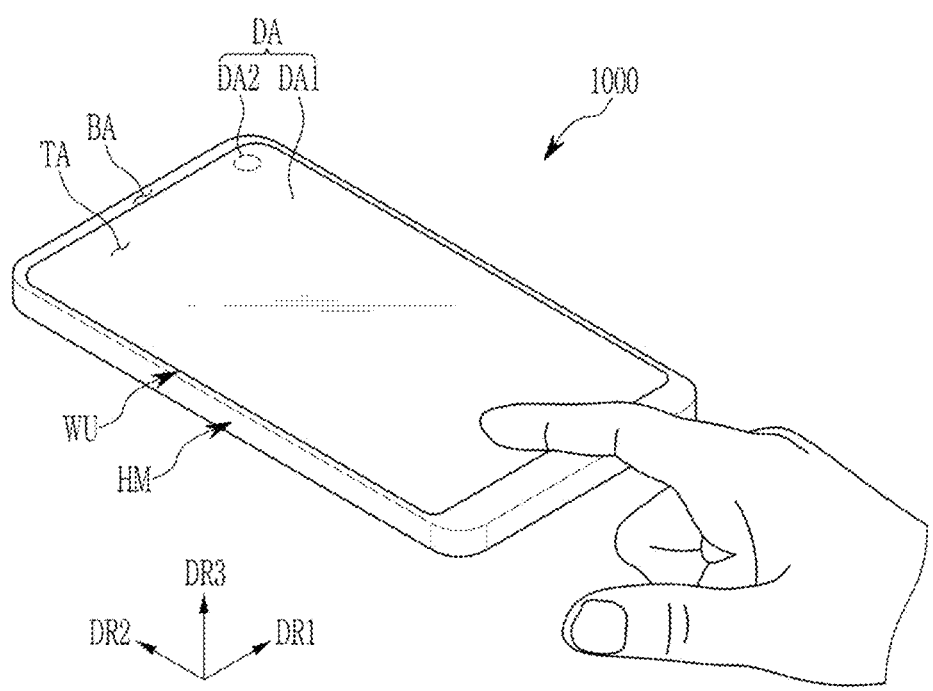
FIG. 1 is a schematic perspective view showing a usage state of a light emitting display device according to an embodiment.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

In addition, parts not related to the description are omitted for clear description of the present disclosure, and like reference numerals designate like elements and similar constituent elements throughout the specification.

Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, areas, etc., are exaggerated for clarity. In the drawings, for better understanding and ease of description, the thicknesses of some layers and areas are exaggerated.

It will be understood that when an element such as a layer, film, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a flat surface" means when an object portion is viewed from above, and the phrase "on a cross-section" means when a cross-section taken by vertically cutting an object portion is viewed from the side.

Hereinafter, a schematic structure of a light emitting display device is described with reference to FIGS. 1, 2, and 3.

Figure 2:
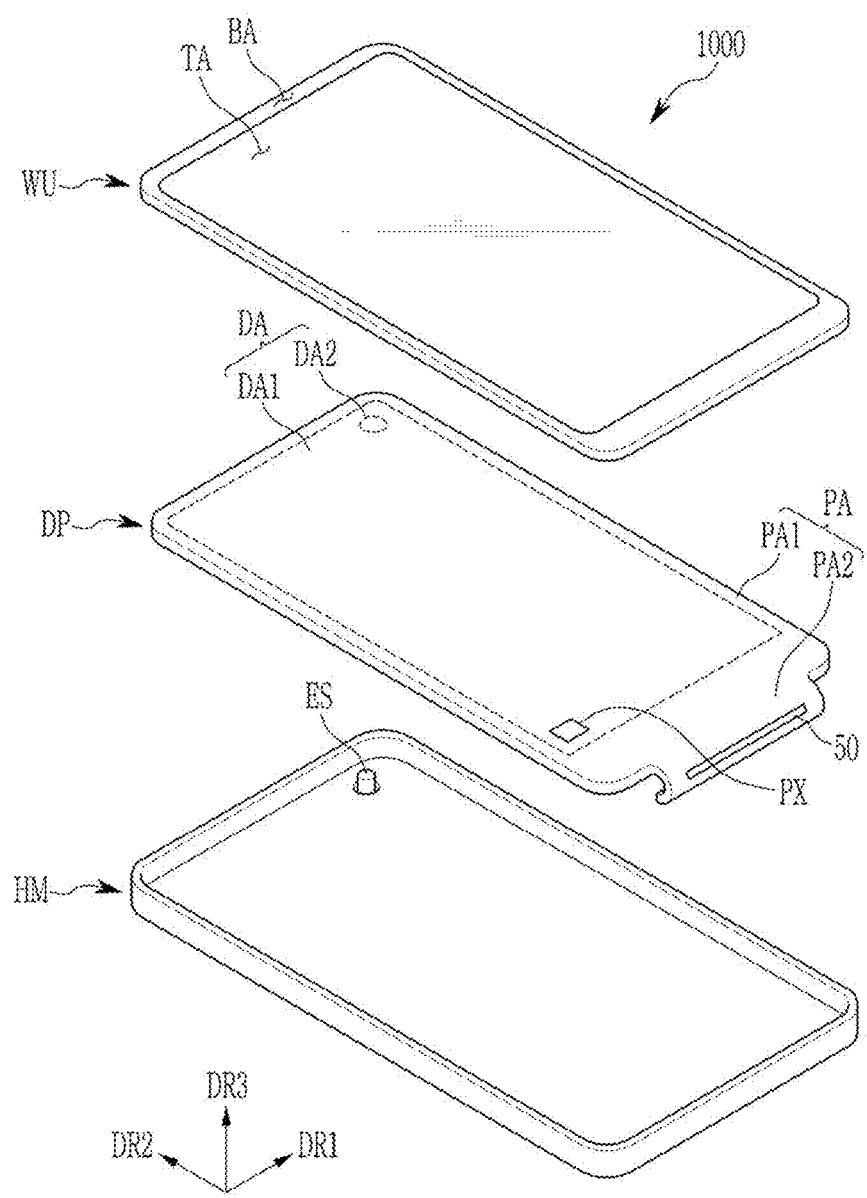
FIG. 2 is an exploded perspective view of a light emitting display device according to an embodiment.
Figure 3:
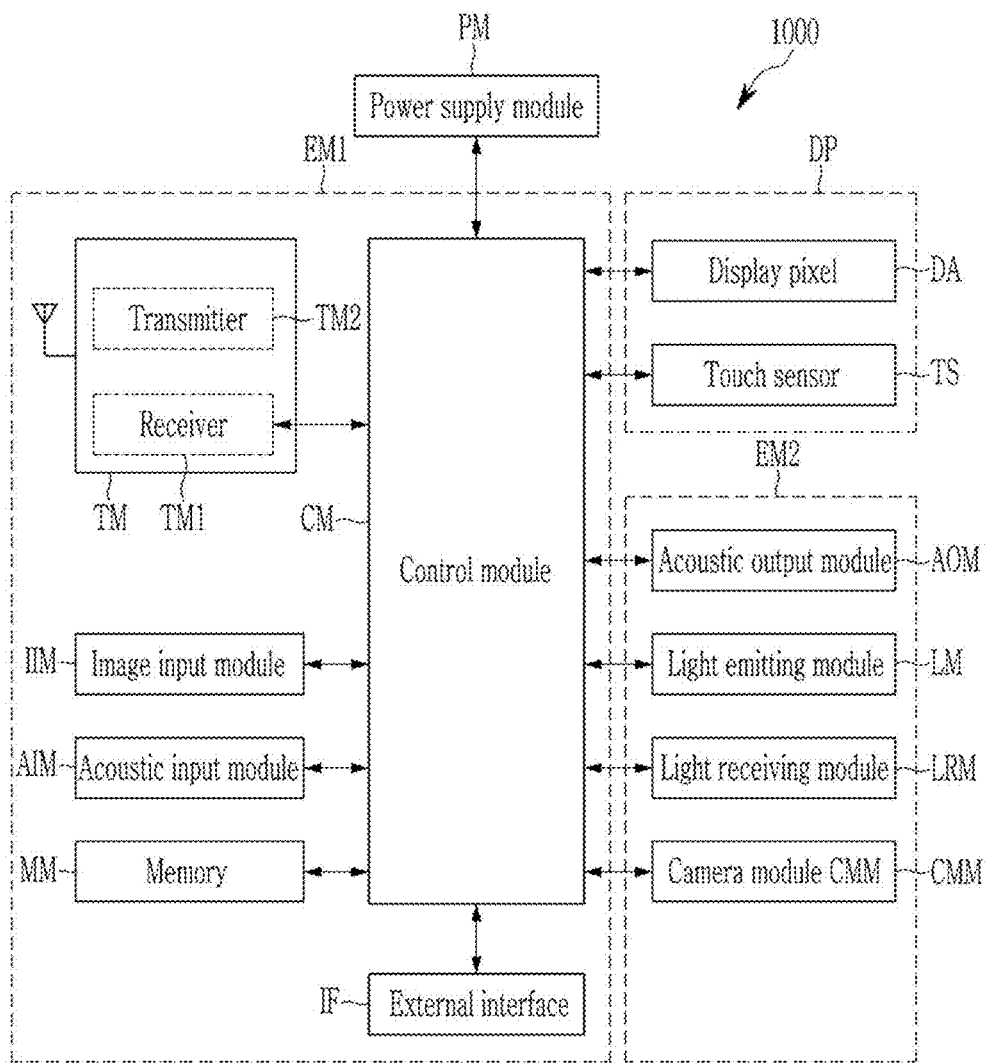
FIG. 3 is a block diagram of a light emitting display device according to an embodiment.

FIG. 1 is a schematic perspective view showing a usage state of a light emitting display device according to an embodiment, FIG. 2 is an exploded perspective view of a light emitting display device according to an embodiment, and FIG. 3 is a block diagram of a light emitting display device according to an embodiment.

A light emitting display device 1000 according to an embodiment as a device for displaying a motion picture or a still image may be used as a display screen of various products such as a television, a laptop, a monitor, an advertisement board, an internet of things (IOT), etc. as well as portable electronic devices such as a mobile phone, a smart phone, a tablet personal computer, a mobile communication terminal, an electronic notebook, an e-books, a PMP (portable multimedia player), a navigation device, a UMPC (Ultra Mobile PC), etc. Also, the light emitting display device 1000 according to an embodiment may be used in wearable devices such as a smart watch, a watch phone, a spectacle display, a head mounted display (HMD), etc. Further, a light emitting display device 1000 according to an embodiment may be used as an instrument panel of a vehicle, a center fascia of a vehicle or a center information display (CID) disposed on a dashboard, a room mirror display instead of a side mirror of a vehicle, an entertainment device for a back seat of a vehicle, or a display disposed at a rear surface of a front seat. FIG. 1, for better comprehension and ease of description, shows that the light emitting display device 1000 is used as a smart phone.

Referring to FIG. 1, FIG. 2, and FIG. 3, the light emitting display device 1000 may display an image toward a third direction DR3 on a display surface parallel to a first direction DR1 and a second direction DR2. The display surface on which the image is displayed may correspond to the front surface of the light emitting display device 1000, and may correspond to the front surface of a cover window WU. The images may include static images as well as dynamic images.

In the present embodiment, a front (or top) and a back (or bottom) of each member are defined based on the direction in which the image is displayed. The front and rear surfaces may be opposite to each other in the third direction DR3, and the normal directions of the front and rear surfaces may be parallel to the third direction DR3. The separation distance in the third direction DR3 between the front and rear surfaces may correspond to the thickness in the third direction DR3 of the light emitting display panel DP.

The light emitting display device 1000 according to an embodiment may detect a user's input (refer to a hand in FIG. 1) applied from the outside. The user's input may include various types of external inputs such as a part of the user's body, light, heat, or pressure. In an embodiment, the user's input is shown with the user's hand applied to the front. However, the present disclosure is not limited thereto. The user's input may be provided in various forms, and the light emitting display device 1000 may sense the user's input applied to the side or rear surface of the light emitting display device 1000 according to the structure of the light emitting display device 1000.

The light emitting display device 1000 may include a display area DA and non-display area PA disposed around the display area DA. Meanwhile, the display area DA may be largely divided into a first display area DA1 and a first element area DA2, hereinafter also referred to as a component area or a second display area, and in an embodiment, the first display area DA1 may include a plurality of pixels for displaying an image, and the first element area DA2 may include a light transmission area LTA, and additionally may also include a pixel that displays the image. The first element area DA2 may be an area that at least partially overlaps with an optical element ES such as a camera or an optical sensor. FIG. 1 shows that the first element area DA2 is provided in a circle shape on the upper right side of the light emitting display device 1000, but the present disclosure is not limited thereto. The first element area DA2 may be provided in various numbers and shapes according to the number and shape of the optical element ES.

The light emitting display device 1000 may receive an external signal required for the optical element ES through the first element area DA2 or may provide a signal output from the optical element ES to the outside. In an embodiment, since the first element area DA2 is provided to overlap the light transmission area LTA, the area of the blocking area BA for forming the light transmission area LTA may be reduced. Here, the blocking area BA is an area having relatively low light transmittance compared to the transmission area TA, and may include a bezel area.

The light emitting display device 1000 may include a cover window WU, a housing HM, a light emitting display panel DP, and an optical element ES. In an embodiment, the cover window WU and the housing HM may be combined to constitute an appearance of the light emitting display device 1000.

The cover window WU may include an insulating panel. For example, the cover window WU may be made of glass, plastic, or a combination thereof.

The front surface of the cover window WU may define the front surface of the light emitting display device 1000. The transmission area TA may be an optically transparent area. For example, the transmission area TA may be an area having visible ray transmittance of about 90% or more.

The blocking area BA may define the shape of the transmission area TA. The blocking area BA may be adjacent to the transmission area TA and surround the transmission area TA. The blocking area BA may be an area having relatively low light transmittance compared to the transmission area TA. The blocking area BA may include an opaque material that blocks light. The blocking area BA may have a predetermined color. The blocking area BA may be defined by a transparent substrate defining the transmission area TA and a bezel layer provided separately, or by an ink layer formed by inserting or coloring the transparent substrate.

The light emitting display panel DP may include a display panel DP for displaying an image, a touch sensor TS, and a driving unit 50. The light emitting display panel DP may include a front surface including a display area DA and a non-display area PA. The display area DA may be an area in which a pixel operates and emits light according to an electrical signal.

In an embodiment, the display area DA is an area where an image is displayed by including a pixel, and may simultaneously be an area where the touch sensor TS is positioned on the upper side in the third direction DR3 of the pixel so that an external input is sensed.

The transmission area TA of the cover window WU may at least partially overlap the display area DA of the light emitting display panel DP. For example, the transmission area TA may overlap the front surface of the display area DA or may overlap at least a portion of the display area DA. Accordingly, the user may recognize an image through the transmission area TA or provide an external input based on the image. However, the present disclosure is not limited thereto. For example, in the display area DA, an area in which an image is displayed and an area in which an external input is detected may be separated from each other.

The non-display area PA of the light emitting display panel DP may at least partially overlap with the blocking area BA of the cover window WU. The non-display area PA may be an area covered by the blocking area BA. The non-display area PA is adjacent to the display area DA and may surround the display area DA. The image is not displayed in the non-display area PA, and a driving circuit or driving wiring for driving the display area DA may be disposed. The non-display area PA may include a first peripheral area PA1 where the display area DA is positioned outside and a second peripheral area PA2 including a driving unit 50, and connection wiring and bending area. In the second embodiment of FIG. 2, the first peripheral area PA1 is positioned on three sides of the display area DA, and the second peripheral area PA2 is positioned on one side of the display area DA. That is, the first peripheral area PA1 faces with the first, second, and third sides of the display area DA, and the second peripheral area PA2 faces with the fourth side of the display area DA, which includes the driving unit 50.

In an embodiment, the light emitting display panel DP may be assembled in a flat state with the display area DA and non-display area PA facing the cover window WU. However, the present disclosure is not limited thereto. The part of the non-display area PA of the light emitting display panel DP may be bent. In this case, a portion of the non-display area PA faces the rear surface of the light emitting display device 1000, so that the blocking area BA shown on the front surface of the light emitting display device 1000 may be reduced, and as shown in FIG. in 2, the second peripheral area PA2 is bent to be positioned on the back side of the display area DA, thereby being assembled.

The display area DA may include a first display area DA1 and a first element area DA2. The first element area DA2 may have relatively high light transmittance compared to the first display area DA1 by including the light transmission area LTA. Also, the first element area DA2 may have a relatively smaller area than the first display area DA1. The first element area DA2 may be defined as an area overlapping the area where the optical element ES is disposed inside the housing HM among the light emitting display panel DP. In an embodiment, the first element area DA2 is shown with a circle shape, but the present disclosure is not limited thereto, and the first element area DA2 may have various shapes such as polygons, ellipses, and figures with at least one curved line.

The first display area DA1 may be adjacent to the first element area DA2. In an embodiment, the first display area DA1 may enclose the entirety of the first element area DA2. However, the present disclosure is not limited thereto. The first display area DA1 may partially surround the first element area DA2.

Referring to FIG. 3, the light emitting display panel DP may include the display area DA including the display pixel and the touch sensor TS. The light emitting display panel DP may be visually recognized by a user from the outside through the transmission area TA by including the pixel, which is a component that generates the image. In addition, the touch sensor TS may be positioned on the pixel, and may sense an external input applied from the outside. The touch sensor TS may detect an external input provided to the cover window WU.

Again, referring to FIG. 2, the second peripheral area PA2 may include a bending part. The display area DA and the first peripheral area PA1 may be in a flat state being substantially parallel to the plane defined by the first direction DR1 and the second direction DR2, and one side of the second peripheral area PA2 may be extended from the flat state and then may have the flat state again after passing through the bending part. As a result, at least a part of the second peripheral area PA2 may be bent and assembled to be positioned on the back side of the display area DA. Since at least a portion of the second peripheral area PA2 overlaps the display area DA on a plane when being assembled, the blocking area BA of the light emitting display device 1000 may be reduced. However, the present disclosure is not limited thereto. For example, the second peripheral area PA2 may not be bent.

The driving unit 50 may be mounted on the second peripheral area PA2, mounted on the bending part, or positioned on one of both sides of the bending part. The driving unit 50 may be provided in a form of a chip.

The driving unit 50 may be electrically connected to the display area DA to transmit an electrical signal to the display area DA. For example, the driving unit 50 may provide data signals to the pixels PX disposed in the display area DA. Alternatively, the driving unit 50 may include a touch driving circuit and may be electrically connected to the touch sensor TS disposed in the display area DA. Meanwhile, the driving unit 50 may include various circuits in addition to the above-described circuits or may be designed to provide various electrical signals to the display area DA.

Meanwhile, the light emitting display device 1000 may have a pad part positioned at the end of the second peripheral area PA2, and may be electrically connected to a flexible printed circuit board (FPCB) including a driving chip by the pad part. Here, the driving chip positioned on the flexible printed circuit board may include various driving circuits for driving the light emitting display device 1000 or connectors for power supply. According to the embodiment, instead of the flexible printed circuit board, a rigid printed circuit board (PCB) may be used.

The optical element ES may be disposed under the light emitting display panel DP. The optical element ES may receive an external input transmitted through the first element area DA2 or may output the signal through the first element area DA2. In an embodiment, the first element area DA2 having relatively high transmittance is provided inside the display area DA, so that the optical element ES may be disposed to overlap the display area DA, and accordingly, the area or the size of the blocking area BA may be reduced.

Referring to FIG. 3, the light emitting display device 1000 may include alight emitting display panel DP, a power supply module PM, a first electric module EM1, and a second electric module EM2. The light emitting display panel DP, the power supply module PM, the first electric module EM1, and the second electric module EM2 may be electrically connected to each other, and the power supply module PM, the first electric module EM1, and the second electric module EM2 may be disposed under the display panel DP or stored in the housing HM. In FIG. 3, the display pixel and touch sensor TS positioned in the display area DA among the configurations of the light emitting display panel DP are illustrated as an example.

The power supply module PM may supply power required for the overall operation of the light emitting display device 1000. The power supply module PM may include a conventional battery module.

The first electric module EM1 and the second electric module EM2 may include various functional modules for operating the light emitting display device 1000. The first electric module EM1 may be directly mounted on a motherboard electrically connected to the display panel DP or mounted on a separate board and electrically connected to the motherboard through a connector (not shown).

The first electric module EM1 may include a control module CM, a wireless communication module TM, an image input module IIM, an acoustic input module AIM, a memory MM, and an external interface IF. Some of the modules are not mounted on the motherboard, but may be electrically connected to the motherboard through a flexible printed circuit board.

The control module CM may control the overall operation of the light emitting display device 1000. The control module CM may be a microprocessor. For example, the control module CM activates or deactivates the display panel DP. The control module CM may control other modules such as the image input module IIM or the acoustic input module AIM based on the touch signal received from the display panel DP.

The wireless communication module TM may transmit/receive a wireless signal with another terminal using a Bluetooth or Wi-Fi line. The wireless communication module TM may transmit/receive a voice signal using a general communication line. The wireless communication module TM includes a transmitter TM1 that modulates and transmits a signal to be transmitted, and a receiver TM2 that demodulates a received signal.

The image input module IIM may process the image signal to be converted into the image data that may be displayed on the light emitting display panel DP. The acoustic input module AIM may receive an external acoustic signal input by a microphone in a recording mode, a voice recognition mode, etc., and convert it into electrical voice data.

The external interface (IF) may serve as an interface connected to an external charger, a wired/wireless data port, a card socket (e.g., a memory card, a SIM/UIM card), and the like.

The second electric module EM2 may include an acoustic output module AOM, a light emitting module LM, a light receiving module LRM, and a camera module CMM, and at least some of these may be positioned on the back of the display area DA as an optical element ES as shown in FIG. 1 and FIG. 2. The optical element ES may include a light emitting module LM, a light receiving module LRM, and a camera module CMM. In addition, the second electric module EM2 may be directly mounted on the motherboard, or mounted on a separate board to be electrically connected to the light emitting display panel DP through a connector (not shown), or electrically connected to the first electric module EM1.

The acoustic output module AOM may convert the acoustic data received from the wireless communication module TM or the acoustic data stored in the memory MM and output it to the outside.

The light emitting module LM may generate and output light. The light emitting module LM may output infrared rays. For example, the light emitting module LM may include an LED element. For example, the light-receiving module LRM may detect infrared rays. The light receiving module LRM can be activated when infrared rays above a certain level are detected. The light receiving module LRM may include a CMOS sensor. After the infrared rays generated by the light emitting module LM are output, they are reflected by an external subject (e.g., a user's finger or face), and the reflected infrared light may be incident on the light receiving module LRM. The camera module CMM may take external images.

In an embodiment, the optical element ES may additionally include an optical detecting sensor or a thermal detecting sensor. The optical element ES may detect an external object received through the front surface or may provide a sound signal such as voice through the front surface to the outside. In addition, the optical element ES may include a plurality of configurations, and is not limited to any one embodiment.

Again, referring to FIG. 2, the housing HM may be combined with the cover window WU. The cover window WU may be disposed in the front surface of the housing HM. The housing HM may be combined with the cover window WU to provide a predetermined accommodation space. The light emitting display panel DP and optical element ES may be accommodated in a predetermined accommodation space provided between the housing HM and the cover window WU.

The housing HM may include a material with relatively high stiffness. For example, the housing HM may include a plurality of frames and/or plates made of glass, plastic, or metal, or a combination thereof. The housing HM may reliably protect the components of the light emitting display device 1000 housed in the interior space from external impact.

In FIG. 1 and FIG. 2, the optical element ES is shown to be positioned in the display area DA, but according to an embodiment, it may be positioned in the peripheral area PA disposed outside the display area DA, and in this case, an area where light is transmitted through the blocking area BA of the cover window WU may be formed.

A structure in which the optical element ES is positioned corresponding to the first element area DA2 positioned in the display area DA is described with reference to FIG. 4.

Figure 4:
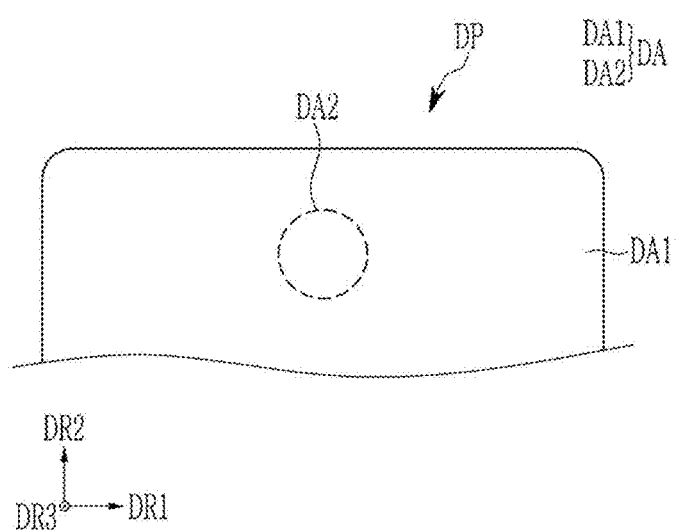
FIG. 4 is a top plan view showing an enlarged partial area of a light emitting display panel according to an embodiment.

FIG. 4 is a top plan view showing an enlarged partial area of a light emitting display panel according to an embodiment.

In FIG. 4, a partial area of the light emitting display panel DP having the first element area DA2 (hereinafter, also referred to as a component area) in which the light transmission area LTA is formed is enlarged and illustrated.

The light emitting display panel DP has the display area DA disposed on the front surface, and the display area DA is largely divided into a first display area DA1 (hereinafter referred to as a main display area) and a first element area DA2 (hereinafter also referred to as a component area).

In the first display area DA1, a plurality of light emitting diodes (LEDs), and a plurality of pixel circuit units for generating and transmitting light emitting currents to each of a plurality of light emitting diodes (LEDs) are formed. Here, one light emitting diode (LED) and one pixel circuit unit are referred to as a pixel PX. In the first display area DA1, one pixel circuit unit and one light emitting diode (LED) are formed one-to-one. The first display area DA1 is hereinafter also referred to as a normal display area. In FIG. 4, the structure of the light emitting display panel DP under the cut line is not shown, but the first display area DA1 may be positioned under the cut line. The structure of a spacer 385 having a black pixel defining layer 380 and a step positioned in the first display area DA1 may have a structure of FIGS. 4, 5, 6, 7, 8, 9, 10, 11, and 12.

The first element area DA2 is a display area positioned on the front surface of the optical element, and has a structure in which a light transmission area LTA is additionally formed while a plurality of pixels are formed.

A boundary area may be positioned between the first display area DA1 and the first element area DA2.

Although not shown in FIG. 4, a peripheral area may be further positioned outside the display area DA. In addition, FIG. 4 shows the light emitting display panel for a mobile phone, however the present embodiment may be applied if it is the light emitting display panel in which the optical element may be positioned on the back surface of the light emitting display panel, and it may also be a flexible display panel. A case of a foldable display panel among the flexible display panels is now described with reference to FIG. 5 and FIG. 6.

Figure 5:
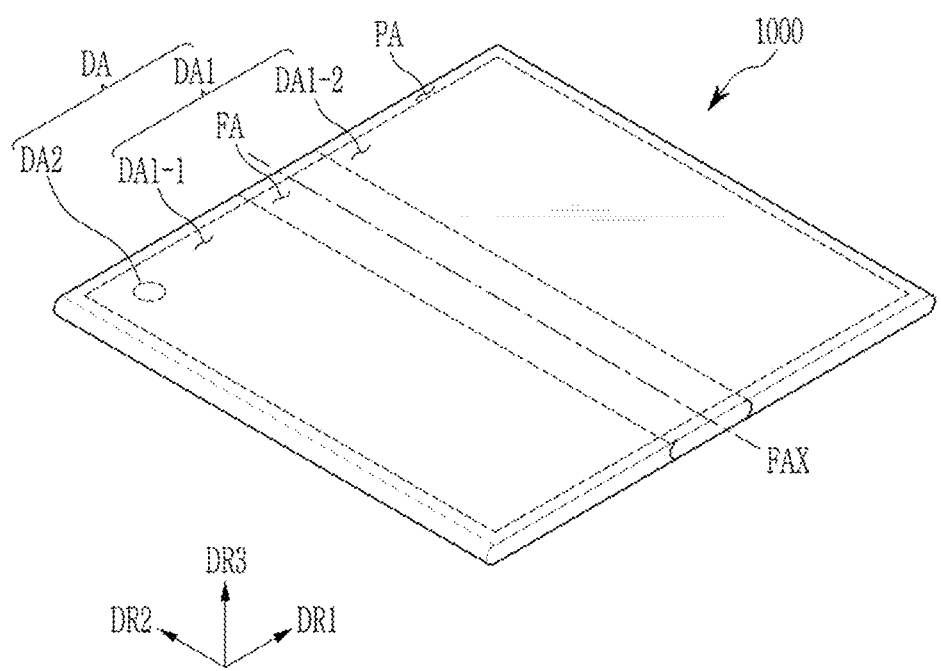
FIG. 5 is a perspective view schematically illustrating a light emitting display device according to another embodiment.
Figure 6:
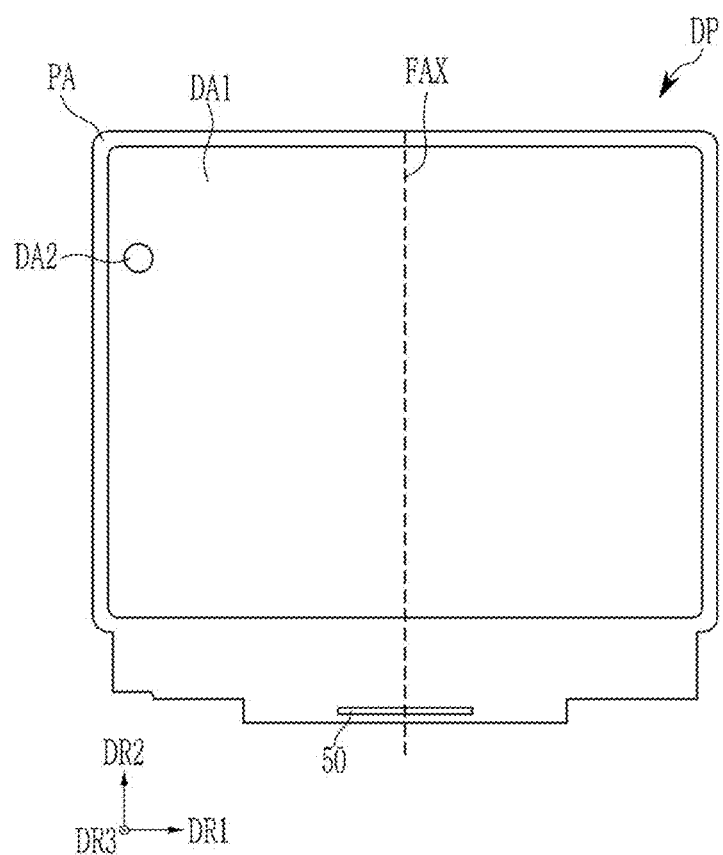
FIG. 6 is a top plan view showing a first element area of a light emitting display panel according to another embodiment.

FIG. 5 is a perspective view schematically illustrating a light emitting display device according to another embodiment, and FIG. 6 is a top plan view showing a first element area of a light emitting display panel according to another embodiment.

FIG. 5 and FIG. 6 show the foldable light emitting display panel of the structure that is folded through a folding line FAX, differently from FIG. 4.

In the foldable light emitting display panel DP, the component area DA2 may be disposed on the edge of one side as shown in FIG. 5 and FIG. 6.

The optical element such as a camera or an optical sensor is positioned on the rear surface of the component area DA2 of FIG. 5 and FIG. 6, and the light transmission area LTA is positioned in the component area DA2.

Referring to FIG. 5, man embodiment, the light emitting display device 1000 may be the foldable light emitting display device. The light emitting display device 1000 may be folded outward or inward based on the folding axis FAX. When being folded outward based on the folding axis FAX, the display surface of the light emitting display device 1000 is positioned on the outside in the third direction DR3, so that the images may be displayed in both directions which are the third direction DR3 and the reverse direction of the third direction DR3. When being folded inward based on the folding axis FAX, the display surface may not be visually recognized from the outside.

The light emitting display device 1000 may include a housing, a light emitting display panel, and a cover window.

In an embodiment, the light emitting display panel may include a display area DA and a non-display area PA. The display area DA is an area in which an image is displayed, and may be an area in which external input is simultaneously sensed. The display area DA may be an area in which a plurality of pixels to be described later are disposed.

The display area DA may include a first display area DA1 and a first element area DA2. In addition, the first display area DA1 may be divided into a first/first display area DA1-1, a first/second element area DA1-2, and a folding area FA. The first/first display area DA1-1 and the first/second element area DA1-2 may be positioned on the left and right sides, respectively, based on (or at the center) of the folding axis FAX, and the folding area FA may be positioned between the first/first display area DA1-1 and the first/second element area DA1-2. At this time, when being folded outward based on the folding axis FAX, the first/first display area DA1-1 and the first/second element area DA1-2 are positioned on both upper and lower sides in the third direction DR3, and the images may be displayed in both directions. In addition, when being folded inward based on the folding axis FAX, the first/first display area DA1-1 and the first/second element area DA1-2 may not be visually recognized from the outside.

On the other hand, in FIG. 6, the peripheral area PA is also shown outside the display area DA, and the driving unit 50 is also shown in the peripheral area PA. In the embodiment of FIG. 6, the driving unit 50 is shown to be positioned in the portion corresponding to the folding line FAX, but the position of the driving unit 50 may be various.

Hereinafter, an embodiment corresponding to both embodiments in which the optical element ES is positioned in the display area DA or outside display area DA is described with reference to FIGS. 7, 8, 9, 10, 11, 12, 13, 14, 15, 16, 17, 18, 19, 20, and 21.

Figure 7:
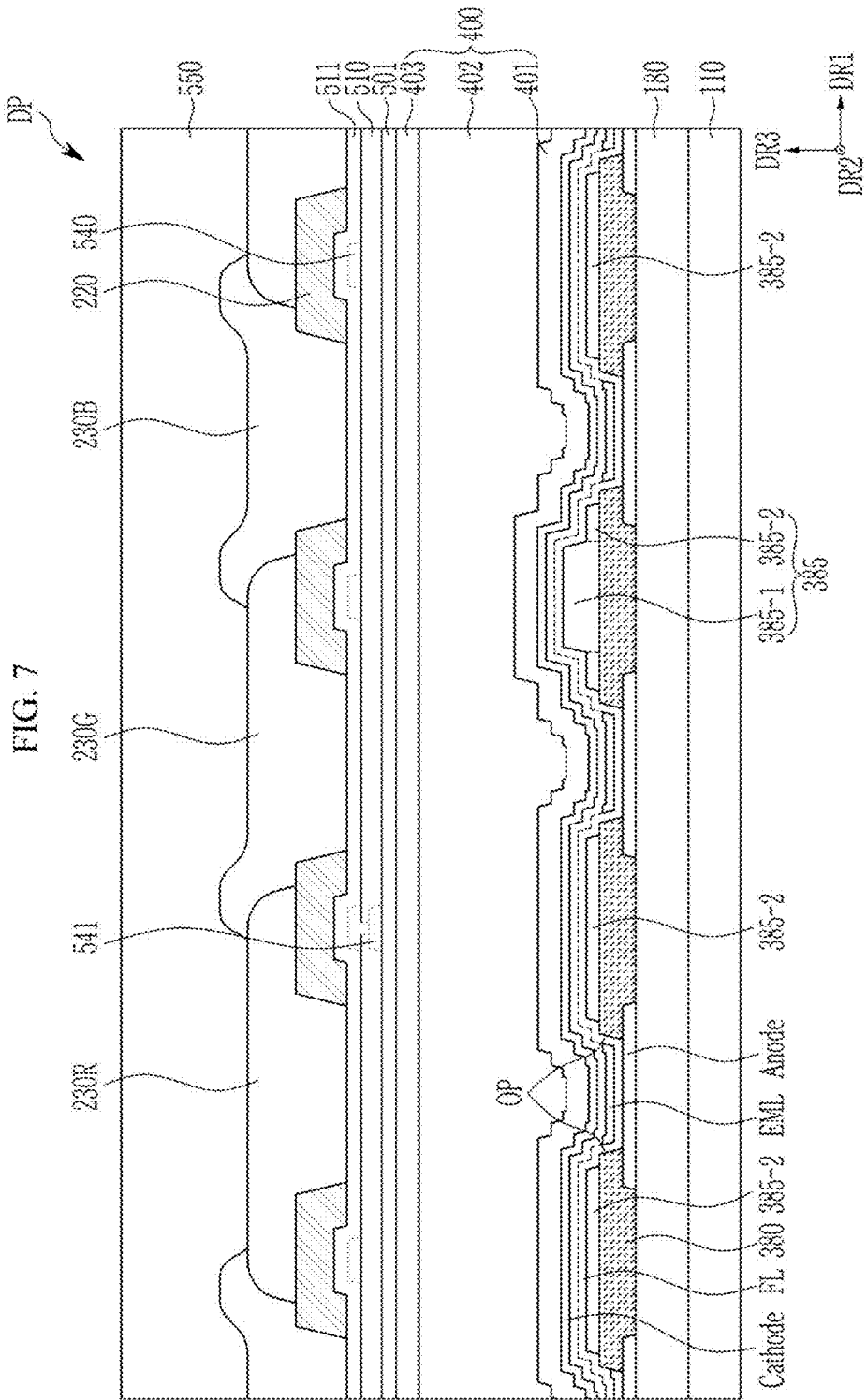
FIG. 7 is a schematic cross-sectional view of a display panel according to an embodiment.

Now, the structure of the light emitting display panel DP according to an embodiment is described with FIG. 7.

FIG. 7 is a schematic cross-sectional view of a display panel according to an embodiment.

The light emitting display panel DP according to an embodiment may display the image by forming the light emitting diode (LED) on the substrate 110, detect the touch by including a plurality of detecting electrodes 540 and 541, and have a color characteristic of color filters 230R, 230G, and 230B due to light emitted from the light emitting diode (LED) by including a light blocking layer 220 and the color filters 230R, 230G, and 230B.

In addition, in the light emitting display panel DP of FIG. 7, the black pixel defining layer 380 distinguishing the emission layer EML among the light emitting diode (LED) is formed of a black color organic material including a light blocking material and a spacer 385 (hereinafter referred to as a main spacer) of a structure having a step is formed on the black pixel defining layer 380. The spacer 385 has a high first portion (385-1 hereinafter referred to as a first main spacer) and a second portion (385-2 hereinafter referred to as a second main spacer) having a lower height than the first portion 385-1 and positioned on the periphery of the first portion 385-1. The first portion 385-1 and the second portion 385-2 may be integrally formed. The spacer 385 may reduce a defect rate due to a pressing pressure by increasing the search strength of the light emitting display panel DP, and also increase adherence with a functional layer FL positioned on the spacer 385 so as to prevent moisture and air from being penetrated from the outside. In addition, the high adherence has a merit in that it may eliminate the problem of decreasing the adherence between layers when the light emitting display panel DP has a flexible characteristic and is folded or unfolded.

In addition, a polarizer is not formed on the front surface of the light emitting display panel DP according to an embodiment, but as the black pixel defining layer 380 is used instead, and the light blocking layer 220 and the color filter 230 are formed thereon, even if the external light is incident inside, it may be prevented from being reflected from an anode and transmitted to the user.

The light emitting display panel DP according to an embodiment is described in detail as follows.

The substrate 110 may include a material that does not bend due to a rigid characteristic such as glass, or a flexible material that can be bent, such as plastic or polyimide.

A plurality of thin film transistors is formed on the substrate 110, but it is omitted in FIG. 7, and only an organic layer 180 covering the thin film transistors is shown. One pixel includes the light emitting diode (LED) and the pixel circuit unit in which a plurality of transistors and capacitors that transmit a light emitting current to the light emitting diode (LED) are formed. In FIG. 7, the pixel circuit unit is not shown, and the structure of the pixel circuit unit may vary according to an embodiment. FIG. 7 shows the structure from the organic layer 180 covering the pixel circuit unit.

On the organic layer 180, the light emitting diode (LED) including an anode (Anode), an emission layer (EML) and a cathode (Cathode).

The anode (Anode) may be composed of a single layer including a transparent conductive oxide film and a metal material, or a multilayer including these. The transparent conductive oxide film may include ITO (Indium Tin Oxide), poly-ITO, IZO (Indium Zinc Oxide), IGZO (Indium Gallium Zinc Oxide), and ITZO (Indium Tin Zinc Oxide), and the metal material may include silver (Ag), molybdenum (Mo), copper (Cu), gold (Au), aluminum (Al), etc.

The emission layer EML may be formed of an organic light emitting material, and the adjacent emission layers EML may display different colors. On the other hand, according to an embodiment, each emission layer EML may display light of the same color due to the color filters 230R, 230G, and 230B positioned thereon.

The black pixel defining layer 380 is positioned on the organic layer 180 and the anode (Anode), the black pixel defining layer 380 has an opening, the opening overlaps the part of the anode Anode, and the emission layer EML is positioned on the anode (Anode) exposed by the opening. The emission layer EML may be positioned only within the opening of the black pixel defining layer 380, and is separated from the adjacent emission layer EML by the black pixel defining layer 380. The black pixel defining layer 380 may be formed of an organic material having a negative type of black color. The organic material having a black color may include the light blocking material, and the light blocking material may include a resin or a paste including carbon black, carbon nanotubes, a black dye, metal particles, and for example, nickel, aluminum, molybdenum, alloys thereof, metal oxide particles (e.g., chromium nitride), and the like. The black pixel defining layer 380 may have a black color including a light blocking material, and may have a characteristic that light is not reflected and is absorbed/blocked. Since the negative type uses the organic material, it may have a characteristic that s portion covered by the mask is removed.

Here, the black pixel defining layer 380 may be formed in the negative type, and the spacer 385 may be formed in a positive type, and they may include materials of the same type.

The spacer 385 is formed on the black pixel defining layer 380. The spacer 385 includes a first portion 385-1 having a high height and positioned in a narrow area and a second portion 385-2 having a low height and positioned in a wide area. FIG. 4 shows that the first portion 385-1 and the second portion 385-2 are separated through a dotted line in the spacer 385. Here, the first portion 385-1 may provide a role of securing rigidity against the pressure by strengthening the search strength. The second portion 385-2 may serve as a contact assistant between the black pixel defining layer 380 and the overlying functional layer FL. The first portion 385-1 and the second portion 385-2 may be formed of the same material, and may be formed of a positive type of photosensitive organic material, and for example, a photosensitive polyimide (PSPI) may be used. Since it has a positive characteristic, the portion not covered by the mask may be removed. The spacer 385 is transparent so that light may be transmitted and/or reflected.

The large portion of the upper surface of the black pixel defining layer 380 is covered by the spacer 385, and the edge of the second portion 385-2 has a structure such that it is spaced apart from the edge of the black pixel defining layer 380, so that the part of the black pixel defining layer 380 has a structure that is not covered by the spacer 385. The second portion 385-2 reinforces the adhesion characteristic between the black pixel defining layer 380 and the functional layer FL by covering even the upper surface of the black pixel defining layer 380 where the first portion 385-1 is not positioned.

The functional layer FL is positioned on the spacer 385 and the exposed black pixel defining layer 380, and the functional layer FL may be formed on the entire surface of the light emitting display panel DP. The functional layer FL may include an electron injection layer, an electron transport layer, a hole transport layer, and a hole injection layer, and the functional layer FL may be positioned on/under the emission layer EML. That is, the hole injection layer, the hole transport layer, the emission layer EML, the electron transport layer, the electron injection layer, and the cathode (Cathode) are sequentially positioned on the anode (Anode), thereby the hole injection layer and the hole transport layer among the functional layer FL may be positioned under the emission layer EML, and the electron transport layer and the electron injection layer may be positioned on the emission layer EML.

The cathode (Cathode) may be formed of a light-transmitting electrode or a reflecting electrode. According to an embodiment, the cathode may be a transparent semi-transparent electrode, and may be formed of a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), and a compound thereof. In addition, a transparent conductive oxide (TCO) such as indium tin oxide (ITO), indium zinc oxide (IZO), zinc oxide (ZnO), or indium oxide ($In_2O_3$) may be further disposed on the metal thin film. The cathode may be integrally formed over the entire surface of the light emitting display panel DP.

An encapsulation layer 400 is positioned on the cathode (Cathode). The encapsulation layer 400 includes at least one inorganic layer and at least one organic layer, and in FIG. 7, it has a triple layer structure including the first inorganic encapsulation layer 401, the organic encapsulation layer 402, and the second inorganic encapsulation layer 403. The encapsulation layer 400 may protect the emission layer EML formed of an organic material from moisture or oxygen that may be flowed in from the outside. According to an embodiment, the encapsulation layer 400 may include a structure in which an inorganic layer and an organic layer are sequentially further stacked.

A detecting insulating layer (501, 510, and 511) and a plurality of detecting electrodes 540 and 541 are positioned on the encapsulation layer 400 for touch sensing. In an embodiment of FIG. 7, the touch is sensed in a capacitive type using two detecting electrodes 540 and 541, but according to an embodiment, the touch may be sensed in a self-cap type using only one detecting electrode. A plurality of detecting electrodes 540 and 541 may be insulated with an intermediate detecting insulating layer 510 interposed therebetween, a lower detecting electrode 541 is positioned on the lower detecting insulating layer 501, and an upper detecting electrode 540 is positioned on the intermediate detecting insulating layer 510, while the upper detecting electrode 540 is covered by the upper detecting insulating layer 511. A plurality of detecting electrodes 540 and 541 may be electrically connected through an opening positioned in the intermediate detecting insulating layer 510. Here, the detecting electrodes 540 and 541 may include a metal or a metal alloy such as aluminum (Al), copper (Cu), silver (Ag), gold (Au), molybdenum (Mo), titanium (Ti), or tantalum (Ta), and may be composed of a single layer or multiple layers.

The light blocking layer 220 and the color filters 230R, 230G, and 230B are positioned on the upper detecting insulating layer 511.

The light blocking layer 220 may be positioned so as to overlap the detecting electrodes 540 and 541 in a plan view, and may be positioned so as to not overlap the anode in a plan view. This is to prevent the anode and the emission layer EML capable of displaying the image from being obscured by the light blocking layer 220 and the detecting electrodes 540 and 541.

The color filter 230R, 230G, and 230B are positioned on the detecting insulating layers 501, 510, and 511 and the light blocking layer 220. The color filters 230R, 230G, and 230B include a red color filter 230R that transmits red light, a green color filter 230G that transmits green light, and a blue color filter 230B that transmits blue light. Each of the color filters 230R, 230G, and 230B may be positioned so as to overlap the anode of the light emitting diode (LED) in a plan view. Since light emitted from the emission layer EML may be emitted while being changed to a corresponding color while passing through the color filter, all of the light emitted from the emission layer EML may have the same color. However, in the emission layer EML, different colors of light are displayed, and the displayed color may be enhanced by passing through the color filter of the same color.

The light blocking layer 220 may be respectively positioned between the color filters 230R, 230G, and 230B. According to an embodiment, the color filters 230R, 230G, and 230B may be replaced with a color conversion layer, or may further include a color conversion layer. The color conversion layer may include quantum dots.

A planarization layer 550 covering the color filters 230R, 230G, and 230B is positioned on the color filters 230R, 230G, and 230B. The planarization layer 550 is for planarizing the upper surface of the light emitting display panel, and may be a transparent organic insulator containing at least one material selected from a group consisting of polyimide, polyamide, acryl resin, benzocyclobutene, and phenol resin.

According to the embodiment, on top of the planarization layer 550, a low refractive layer and an additional planarization layer may be further positioned to improve front visibility and light output efficiency of the display panel. Light may be emitted while being refracted to the front by the low refractive layer and the additional planarization layer having a high refractive characteristic. In this case, the low refractive layer and the additional planarization layer may be positioned directly on the color filter 230 while the planarization layer 550 is omitted according to an embodiment.

In the present embodiment, the polarizer on the planarization layer 550 is not included. That is, the polarizer may serve to prevent display deterioration that the user recognizes as the external light is incident and reflected from the anode and the like. However, in the present embodiment, the black pixel defining layer 380 covers the side of the anode (Anode) to reduce the degree of reflection from the anode (Anode), and the light blocking layer 220 is also formed to reduce the incidence of light, thereby the structure for preventing the deterioration of the display quality due to the reflection is already included. Therefore, there is no need to separately from the polarizer on the front of the light emitting display panel DP.

Hereinafter, the structure of the black pixel defining layer 380 and the spacer 385 according to the present embodiment is described in more detail with reference to FIGS. 8, 9, 10, and 11.

Figure 8:
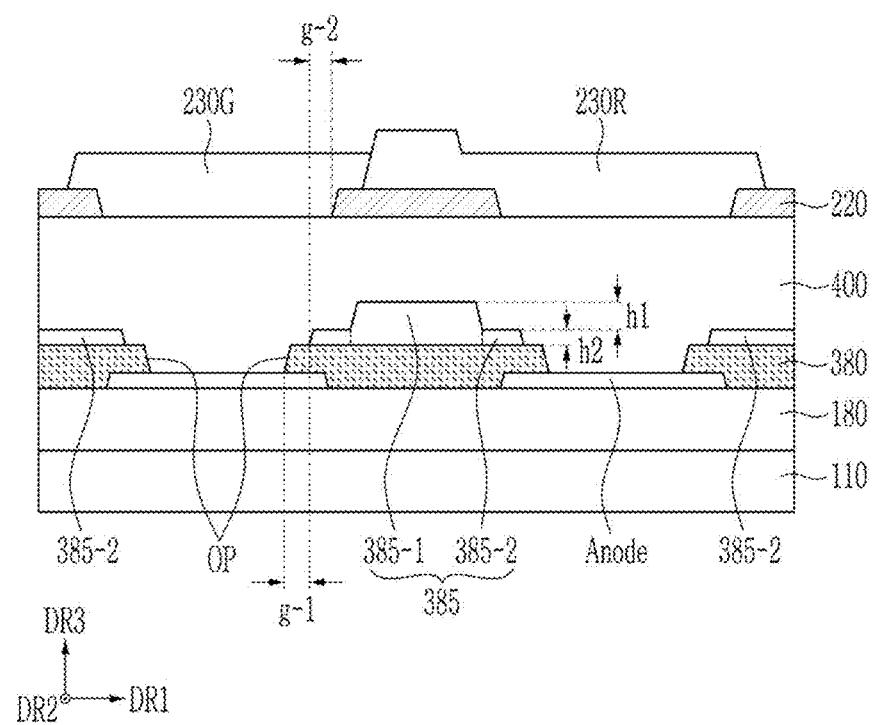
FIG. 8 is an enlarged cross-sectional view of some portion of a display panel according to an embodiment.
Figure 9:
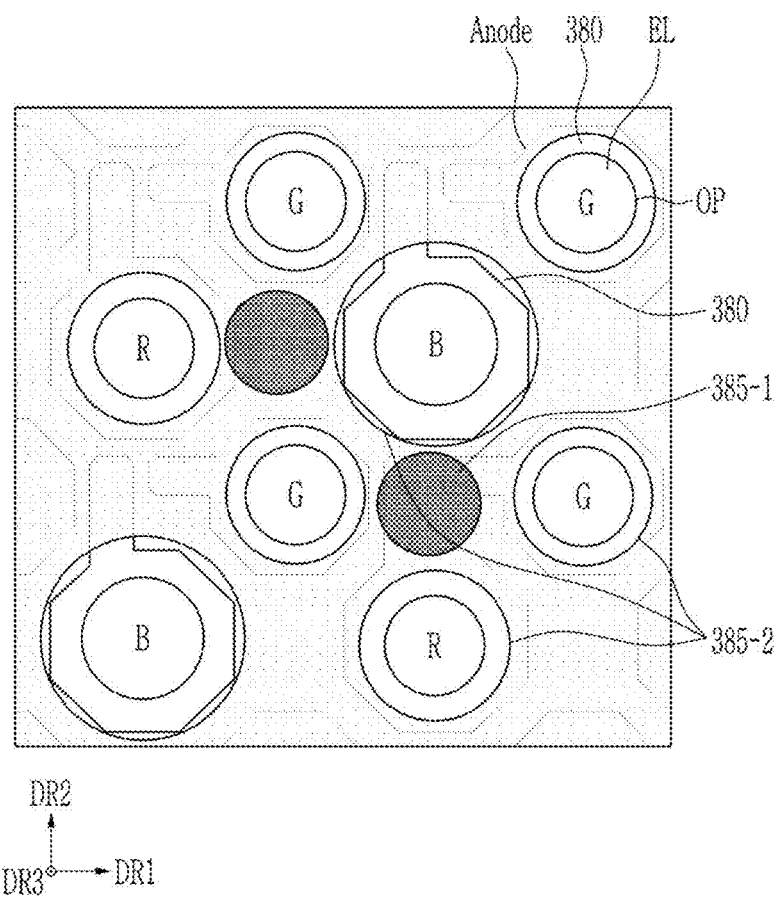
FIG. 9 is a top plan view of some portion of a display panel according to an embodiment.
Figure 10:
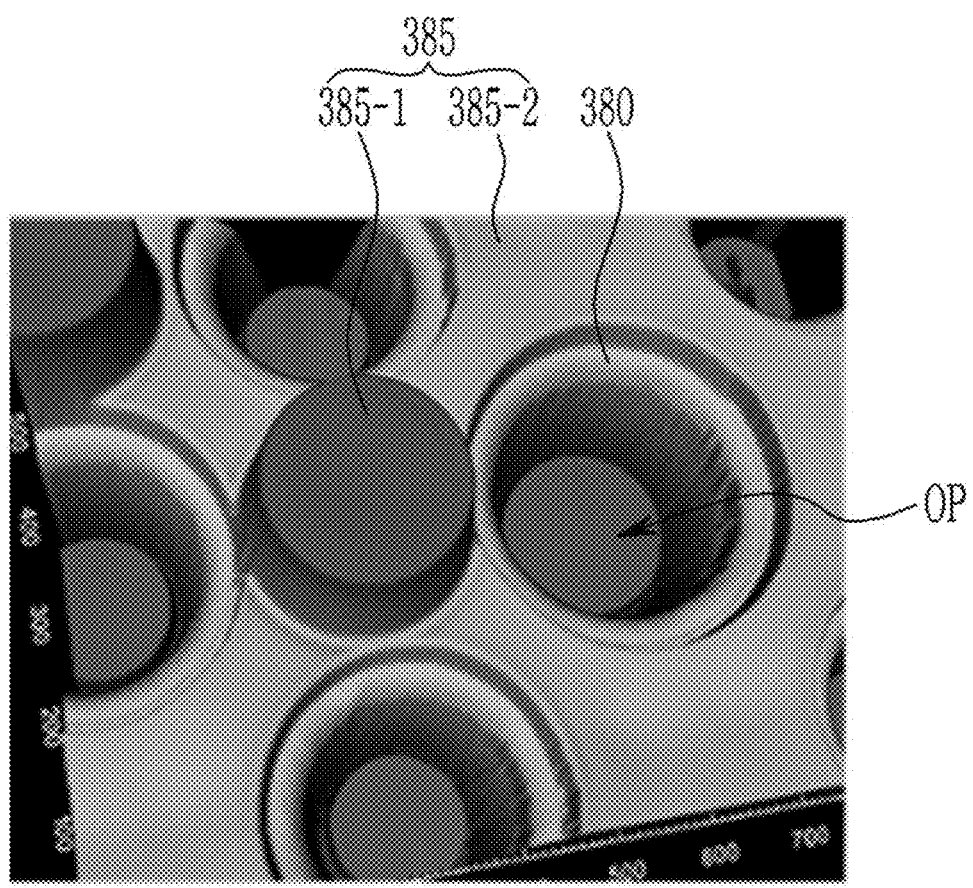
FIG. 10 is an enlarged view of some portion of a display panel according to an embodiment.
Figure 11:
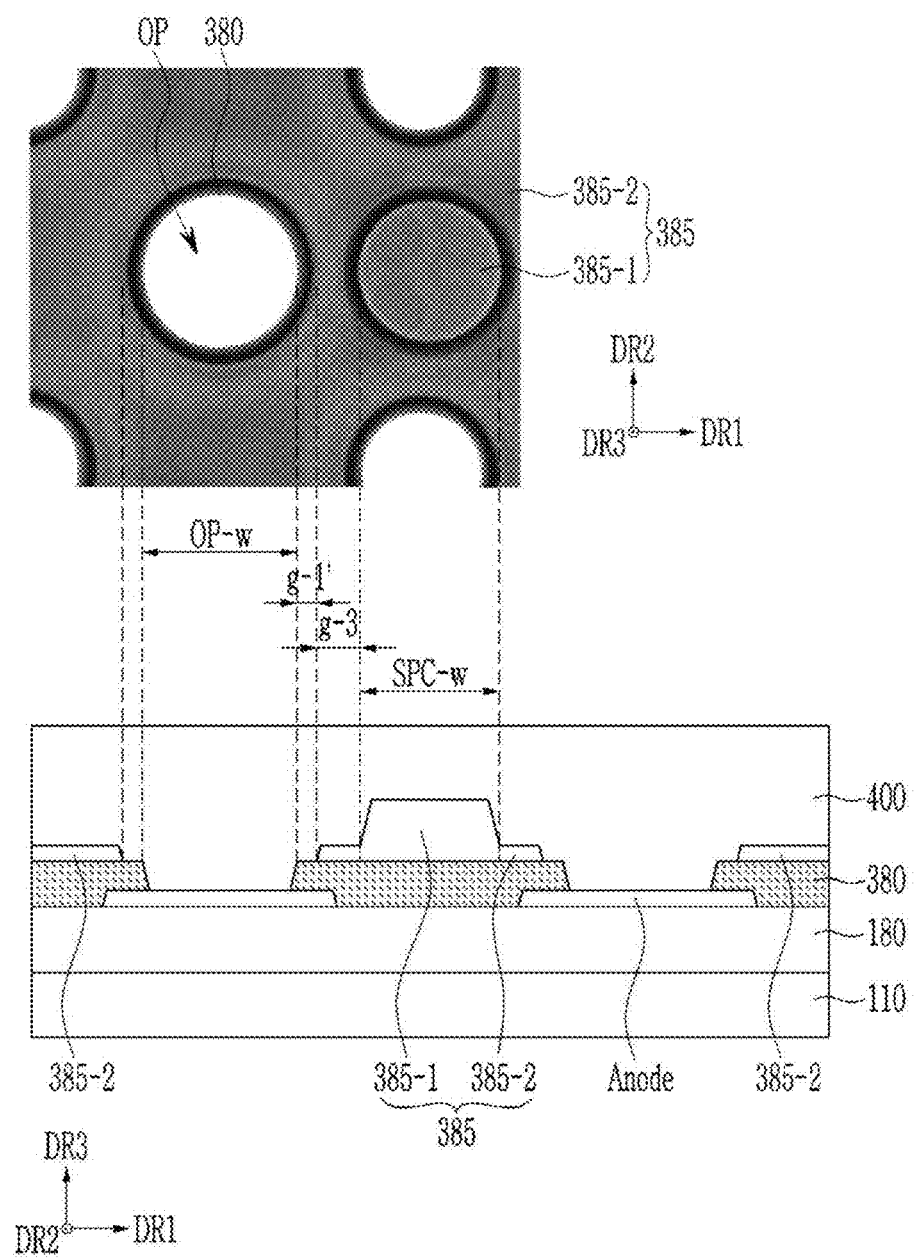
FIG. 11 is a view showing a flat structure corresponding to a photograph taken of a part of a display panel according to an embodiment.

FIG. 8 is an enlarged cross-sectional view of some portion of a display panel according to an embodiment, FIG. 9 is a top plan view of some portion of a display panel according to an embodiment, FIG. 10 is an enlarged view of some portion of a display panel according to an embodiment, and FIG. 11 is a view showing a flat structure corresponding to a photograph taken of a part of a display panel according to an embodiment.

In FIGS. 8, 9, 10, and 11, the emission layer EML, the functional layer FL, and the cathode (Cathode) are omitted, however in FIG. 8, to clearly show the relation with the light blocking layer 220, the light blocking layer 220 and the color filter are additionally shown.

In FIG. 8, the opening OP is defined in the black pixel defining layer 380 and is positioned on the anode (Anode). In addition, the opening OP overlaps a portion of the anode (Anode) to expose a part of the upper surface of the anode (Anode). On the exposed anode (Anode) and in the opening OP of the black pixel defining layer 380, although not shown in FIG. 8, the emission layer EML is positioned. The black pixel defining layer 380 has a black color so that light is not reflected from a portion of the anode (Anode) covered by the black pixel defining layer 380. Meanwhile, the emission layer EML may include different materials depending on the color to be displayed, and accordingly, the size of the opening OP of the black pixel defining layer 380 may be determined. Here, the size of the opening OP of the black pixel defining layer 380 is related to the lifetime of the emission layer EML, and when the material of the emission layer EML is determined, the opening OP may be formed with a size set in consideration of the lifetime.

A spacer 385 having a step structure is formed on the black pixel defining layer 380. The spacer 385 includes a first portion 385-1 having a high height and positioned in a narrow area, and a second portion 385-2 having a low height and positioned in a wide area. The second portion 385-2 has a height as high as h2 from the top surface of the black pixel defining layer 380, and the first portion 385-1 has a height higher than the top surface of the second portion 385-2 by h1, thereby having a total height of h1+h2 from the top surface of the black pixel defining layer 380. In one embodiment, the height h1 of the first portion 385-1 may be about 1.5 μm, and the height h2 of the second portion 385-2 may have about 0.4 μm. According to an embodiment, the heights of two spacers 385-1 and 385-2 may vary, and the height h2 of the second portion 385-2 may be less than half the total height h1+h2 of the first portion 385-1. The protruded height of the first portion 385-1, that is, the height difference h1 from the second portion 385-2, may be 1.0 μm or more and 1.4 μm or less, and the height h2 of the second portion 385-2 may be 0.1 μm or more and 0.5 μm or less. According to an embodiment, the height difference h1 between the first portion 385-1 and the second portion 385-2 may have a value of 0.8 μm or more and 1.0 μm or less. According to an embodiment, the height (h1+h2) of the first portion 385-1 may be 1.1 μm or more and 2.0 μm or less.

On the other hand, the second portion 385-2 forms only a horizontal interval of g–1 from the edge of the black pixel defining layer 380, so that the edges thereof are spaced apart from each other. Here, the interval of g–1 corresponds to the area that is not covered by the spacer 385 among the planar area of the black pixel defining layer 380, and the planar area ratio of the black pixel defining layer 380 covered by spacer 385 may be about 90%, and according to an embodiment, it may be 50% or more and 95% or less.

According to the structure of the spacer 385 having the step as described above, the scratch strength is strengthened by the structure protruded by the first portion 385-1 to secure the rigidity against the pressing pressure.

In addition, the adhesion characteristic between the black pixel defining layer 380 and the functional layer FL is improved by covering the area that is not covered by the first portion 385-1 among the upper surface of the black pixel defining layer 380 while being positioned as wide as the second portion 385-2, thereby strengthening the interlayer contact force. As a result, the adherence increases so that moisture and air are not penetrated from the outside. High adherence has a merit in that it may eliminate the problem of reducing the adherence between the layers when being folded or unfolded in the case that the light emitting display panel DP has a flexible characteristic.

Here, the spacer 385 may be formed of photosensitive polyimide (PSPI), and the black pixel defining layer 380 may be formed of an organic material having a negative type of black color.

On the other hand, FIG. 8 also shows the horizontal spacing g–2 between the spacer 385 and the light blocking layer 220. The edge of the second portion 385-2 is protruded by g–2 that is more than the edge of the light blocking layer 220, so that it is formed in a wider area. This is to make the opening on the light blocking layer 220 wider than the opening OP of the black pixel defining layer 380 where the emission layer EML is positioned so that the light emitted from the emission layer EML may be emitted into the side at a certain angle.

Such spacer 385 may have the same structure as that of FIG. 9 in a plane area.

FIG. 9 shows the pattern of the anode (Anode), the exposed upper surface and the opening OP of the black pixel defining layer 380, the first portion 385-1, and the second portion 385-2. The first portion 385-1 is indicated by a dark circle, and the second portion 385-2 is entirely formed except at a portion around the opening OP in a plan view. In the portion where the second portion 385-2 is not positioned, the exposed upper surface of the black pixel defining layer 380 and the opening OP of the black pixel defining layer 380 are positioned, and the emission layer EML is also positioned in the opening OP of the black pixel defining layer 380. Since the second portion 385-2 is formed by a certain horizontal distance from the opening OP of the black pixel defining layer 380, the second portion 385-2 may be formed entirely except at the area where the opening OP and the exposed black pixel defining layer 380 are positioned.

When viewing such a structure in a perspective view, it is the same as that of FIG. 10.

In FIG. 10, the structure in which the first portion 385-1 is protruded is shown, the second portion 385-2 is widely positioned on the periphery thereof, and the exposed upper surface of the black pixel defining layer 380 and the opening OP of the black pixel defining layer 380 are formed in the recessed portion where the second portion 385-2 is not positioned.

FIG. 11 shows the relationship between the plan view and the cross-section view more clearly.

In FIG. 11, the width (OP-w) of the opening OP of the black pixel defining layer 380 and the width (SPC-w) of the first portion 385-1 are additionally shown. The width (OP-w) of the opening OP may be changed according to the color displayed by the emission layer EML positioned therein. In addition, in FIG. 11, with respect to the interval of the black pixel defining layer 380 and the edge of the second portion 385-2, the interval (g–1') with the edge of the upper surface of the black pixel defining layer 380 has a slight difference from the interval (g–1) in FIG. 8. As a result, in a plane view, the exposed upper surface of the black pixel defining layer 380 is more clearly shown.

Hereinafter, the specific height difference in the light emitting display panel DP according to an embodiment is described with reference to FIG. 12.

Figure 12:
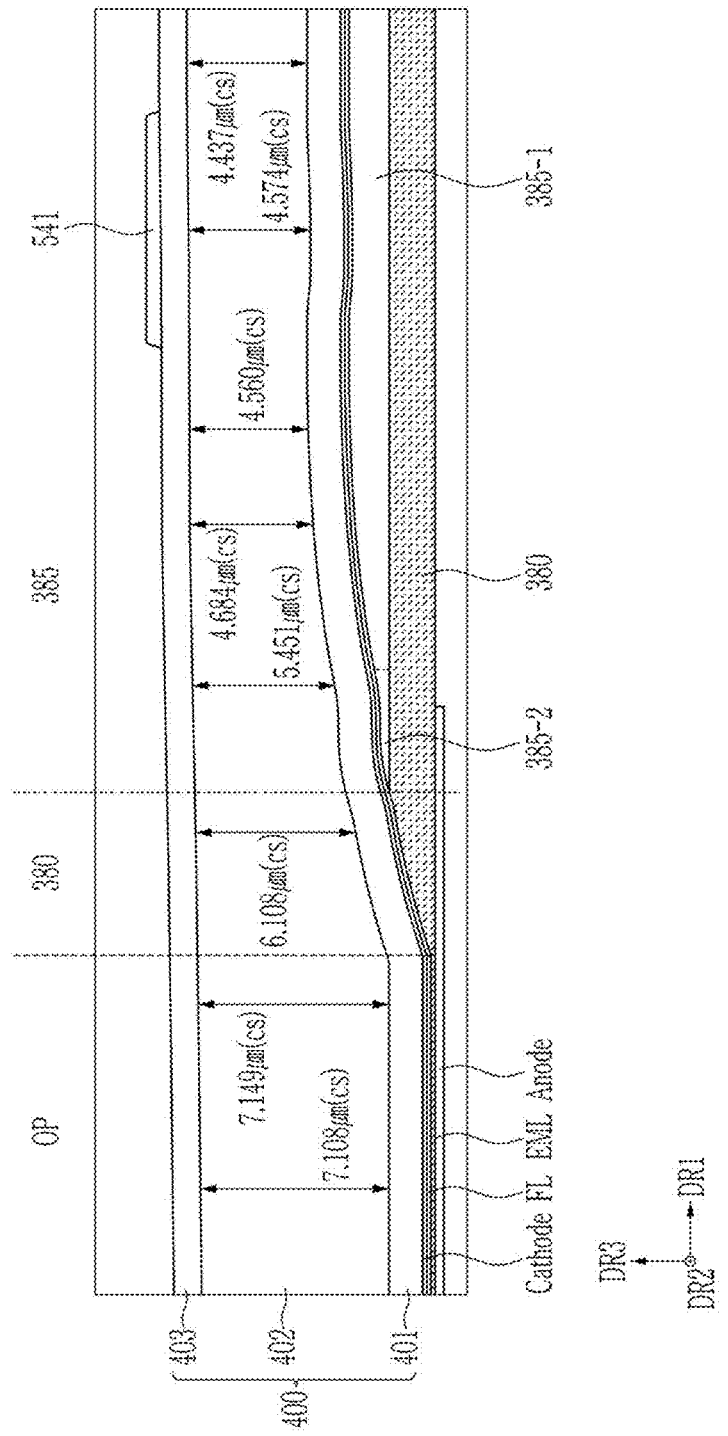
FIG. 12 is a view showing and distinguishing each position and thickness in a cross-section taken of a display panel according to an embodiment.

FIG. 12 is a view showing and distinguishing each position and thickness in a cross-section taken of a display panel according to an embodiment.

FIG. 12 shows the thicknesses in the various positions of the organic encapsulation layer 402 along the encapsulation layer 400.

In FIG. 12, the thickness of the actual layer is thin, so it may be difficult to distinguish it, but there is a color classification for each layer, so the layers may be distinguished and checked based on the change of the colors.

The thickness of the layer (the first inorganic encapsulation layer 401, the cathode (Cathode), the functional layer FL, etc.) disposed under the organic encapsulation layer 402 may be uniformly formed so that the thickness of the spacer 385 and the black pixel defining layer 380 that are indirectly disposed downwardly may be confirmed.

In FIG. 12, the thickness of the organic encapsulation layer 402 above the first portion 385-1 may have about 4.574 µm or 4.437 µm, and the thickness of the organic encapsulation layer 402 above the second portion 385-2 may be 5.451 µm, thereby the height difference of the first portion 385-1 and the second portion 385-2 may have the value of 0.877 µm or more to 1.014 µm or less.

In FIG. 12, above the portion where the spacer 385 and the black pixel defining layer 380 are not formed, the thickness of the organic encapsulation layer 402 is 7.108 µm and the total thickness of the spacer 385 and the black pixel defining layer 380 has the value of 2.534 µm or more to 2.671 µm or less, thereby the thickness of the black pixel defining layer 380 may have the value of 1.52 µm or more to 1.794 µm or less.

Hereinafter, the position of the first portion 385-1 according to an embodiment is described with reference to FIG. 13.

Figure 13:
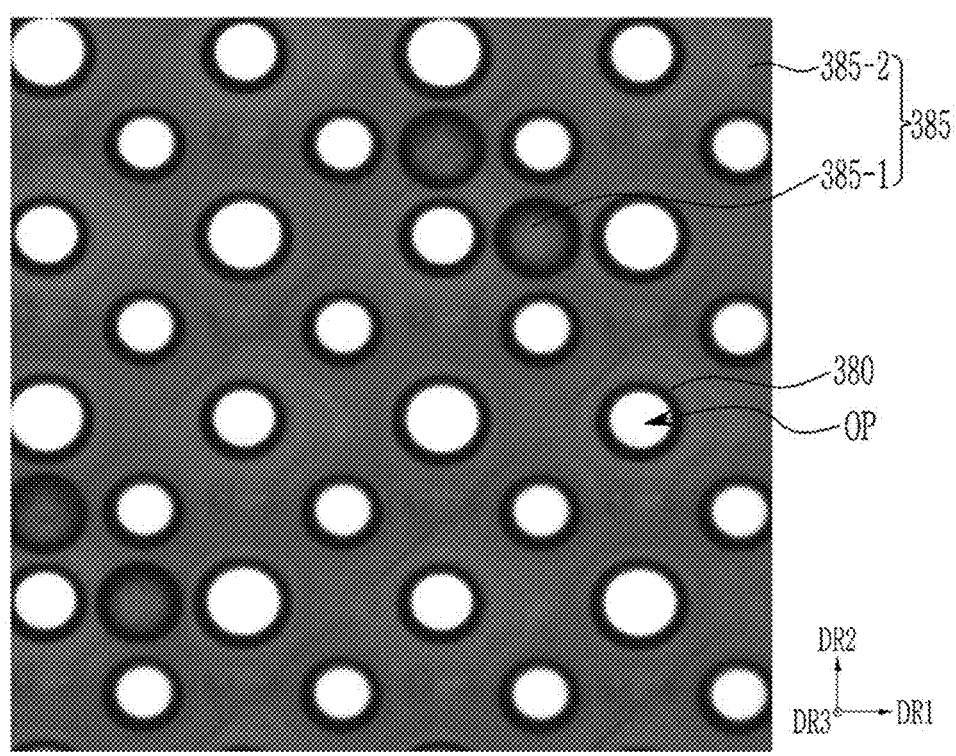
FIG. 13 is a view showing a position of a first portion in a spacer in a display panel according to another embodiment.

FIG. 13 is a view showing a position of a first portion in a spacer in a display panel according to another embodiment.

As shown in FIG. 13, the second portion 385-2 is formed entirely except for the exposed upper portion and the opening OP of the black pixel defining layer 380, but it is illustrated that the first portion 385-1 may be formed intermittently if necessary. According to FIG. 13, only four first portions 385-1 are shown, and two first portions 385-1 are formed adjacent to each other. The first portion 385-1 may be variously positioned.

Hereinafter, the effect according to the present embodiment is described with reference to FIGS. 14, 15, 16, 1, 7, 18, 19, 20 and 21.

First, the characteristic for the scratch strength is described with reference to FIGS. 14, 15, 16, and 17.

Figure 14:
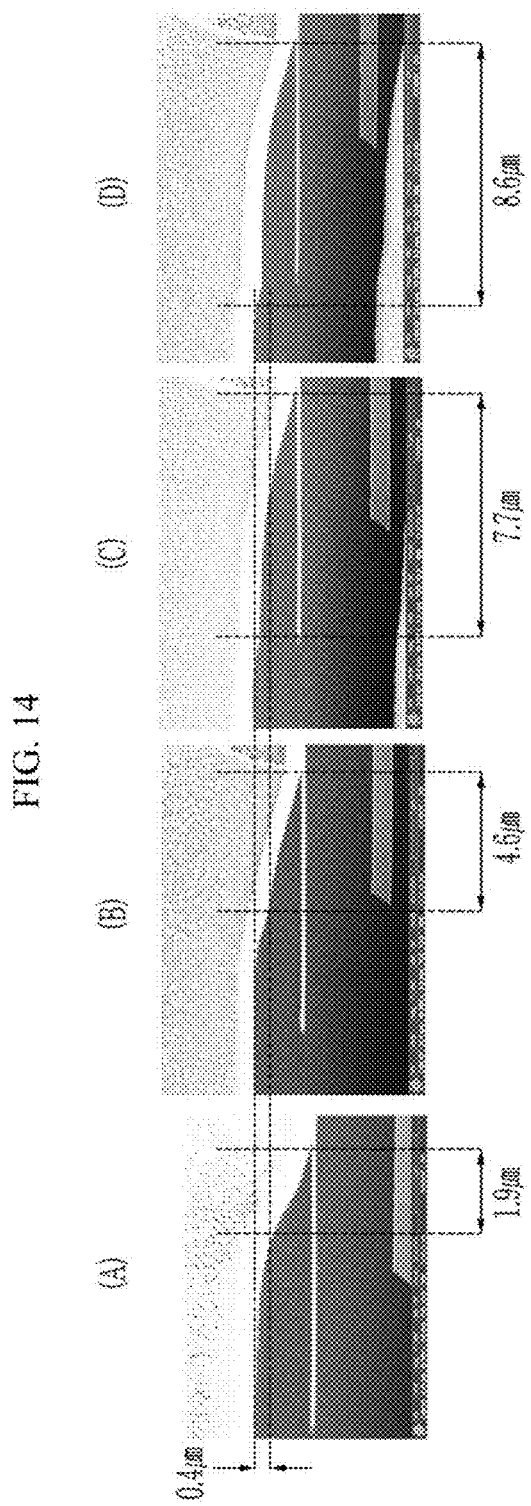
FIG. 14 and FIG. 15 are views showing a structure of four embodiments.
Figure 15:
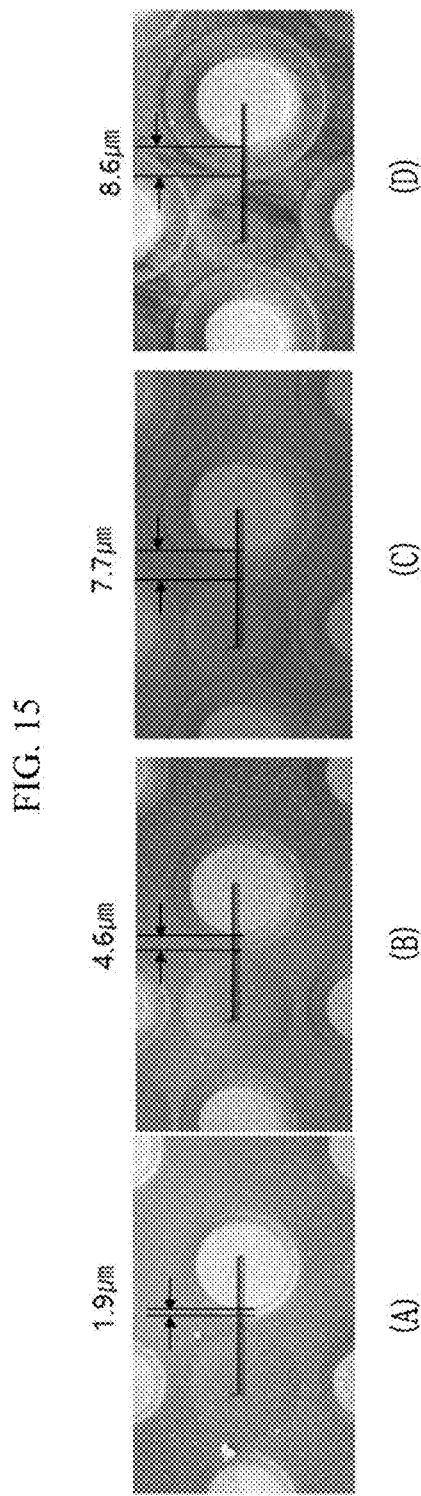
Figure 16:
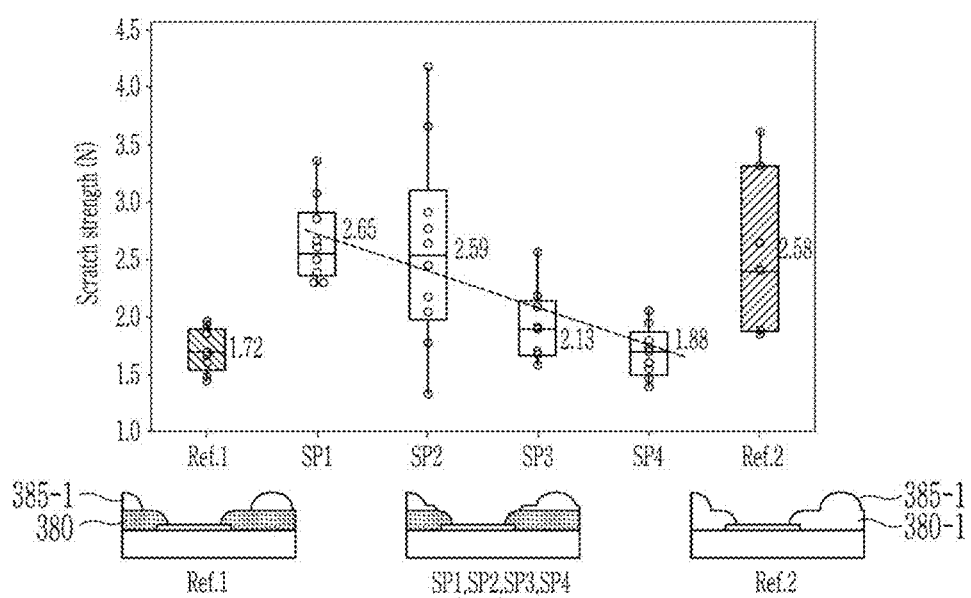
FIG. 16 is a graph showing comparison of scratch strength for four embodiments of FIG. 14 and FIG. 15 and a comparative example.

FIGS. 14, 15, and 16 describes the scratch strength for four embodiments.

FIG. 14 and FIG. 15 are views showing a structure of four embodiments, and FIG. 16 is a graph showing the comparison of scratch strength for four embodiments of FIG. 14 and FIG. 15 and a comparative example.

In FIG. 14 and FIG. 15, the structure of four embodiments is first described.

In FIG. 14 and FIG. 15, (A), (B), (C), and (D) are cross-section views and top plan views corresponding to each other, respectively, where (A) of FIG. 14 and FIG. 15 is indicated by SP1 in FIG. 16, (B) is indicated by SP2, (C) is indicated by SP3, and (D) is indicated by SP4.

The horizontal interval shown in FIG. 14 and FIG. 15 is g–1 of FIG. 5 and is the horizontal interval between the edges of the second portion 385-2 and the black pixel defining layer 380. On the other hand, referring to FIG. 14, the height of the second portion 385-2 was all formed to be 0.4 μm.

The values measured through FIG. 14 and FIG. 15 are measured by taking one of the various embodiments manufactured according to Table 1 below.

Meanwhile, in Table 1 below, the value of g–2 of FIG. 5 is also included and described, and the value of g–2 is the horizontal interval between the spacer 385 and the light blocking layer 220.

TABLE 1

| unit: μm | SP1 | SP2 | SP3 | SP4 |
|---|---|---|---|---|
| Spacer density | All the same as 2.826% | | | |
| g-1 actually measured value average | 1.8 | 4.3 | 7.3 | 8.8 |
| g-1 design value | 1.3 | 3.8 | 6.8 | 8.3 |
| g-2 actually measured value average | 3.92 | 1.42 | -1.58 | -3.08 |
| g-2 designed value | 5.97 | 3.47 | 0.47 | -1.03 |

In Table 1, a g–1 design value was designed considering a more etched value (0.5 μm) generated when forming the second portion 385-2, and a g–2 design value was designed considering a less etched value (1.55 μm) generated in the light blocking layer 220 in addition to the additionally etched value (0.5 μm) of the second portion 385-2 like g–1. As a result, a g–1 actually measured value average has a larger value than the g–1 design value by about 0.5 μm, and a g–2 actually measured value average has a smaller value than the g–2 design value by about 2.0 μm. For reference, the portion indicated by "a spacer density" in Table 1 represents an area ratio of the first portion 385-1 of the spacer 385 with respect to an entire area, and may have a value of 1% or more and 5% or less according to an embodiment.

On the other hand, in FIG. 16, two comparative examples Ref.1 and Ref.2 are also included.

The comparative example 1 Ref.1 is an example, and as shown in a lower part of FIG. 16, the first portion 385-1 is only formed on the black pixel defining layer 380 and the second portion 385-2 is not included.

The comparative example 2 (Ref.2) is an example, and as shown in a lower part of FIG. 16, a pixel definition layer 380-1 and a first portion 385-1 are formed together as a transparent organic insulating material (for example, a photosensitive polyimide (PSPI)) without using the black pixel defining layer 380.

A graph of results of testing the scratch strength for all six examples is shown in FIG. 16.

In FIG. 16, the number listed next to each bar graph is the average of the scratch strength of the corresponding example.

According to FIG. 16, it may be confirmed that the embodiments of SP1, SP2, SP3, and SP4 have improved average scratch strength compared to the comparative example 1 (Ref.1). Since Comparative Example 2 (Ref.2) has a higher value than Comparative Example 1 Ref.1 in the aspect of the scratch strength, it may be confirmed that only the SP1 and SP2 embodiments have the improved average scratch strength compared to Comparative Example 2 (Ref.2).

Considering FIG. 16 and Table 1, if the horizontal interval g–1 between the edges of the second portion 385-2 and the black pixel defining layer 380 is too large, the scratch strength decreases, so it may have the value of 1.8 μm or more and 4.3 μm or less. On the other hand, in a case of wanting to have the improved scratch strength compared to Comparative Example 1 (Ref.1), it may have the value of about 1.5 μm or more to about 8.8 μm or less.

In the above, the horizontal interval g–1 between the edges of the second portion 385-2 and the black pixel defining layer 380 was mainly examined, and hereinafter, it is changed into a concept of an area ratio and examined through Table 2.

TABLE 2

| | SP1 | SP2 | SP3 | SP4 |
|---|---|---|---|---|
| Spacer area ratio for entire area | 80% | 70% | 57% | 50% |
| Spacer area ratio for black pixel defining layer | 93% | 83% | 67% | 58% |

Considering FIG. 16 and Table 2, it may have the area ratio equivalent to SP1 and SP2, and the area ratio of the spacer 385 for the entire area of the light emitting display panel DP may have the value of 70% or more and 80% or less, while the area ratio of the spacer 385 for the area occupied by the black pixel defining layer 380 may have the value of 83% or more and 93% or less. On the other hand, if it is desired to have the improved scratch strength than Comparative Example 1 (Ref. 1), the area ratio of the spacer 385 compared to the area occupied by the black pixel defining layer 380 may have the value of about 50% or more and about 95% or less.

On the other hand, the scratch strength may be affected by the layer positioned on the spacer 385, and the scratch strength is also changed by the thickness of the organic encapsulation layer 402 among the encapsulation layer 400, which is the most affected.

Hereinafter, the scratch strength according to the thickness of the organic encapsulation layer 402 and the height of the second portion 385-2 are described with reference to FIG. 17.

Figure 17:
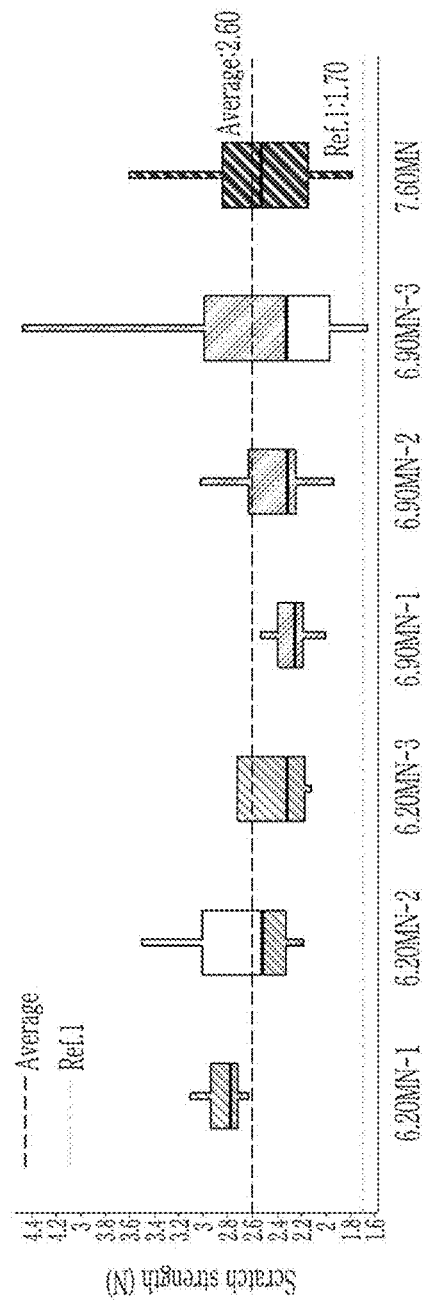
FIG. 17 is a graph showing scratch strength for various embodiments.

FIG. 17 is a graph showing a scratch strength according to various embodiments.

FIG. 17 shows a scratch strength for total seven embodiments, and each embodiment 6.20MN-1, 6.20MN-2, 6.20MN-3, 6.90MN-1, 6.90MN-2, 6.90MN-3, and 7.60MN corresponds to seven embodiments described in Table 3 below correspond one by one from the left.

TABLE 3

| | Organic-encapsulation layer thickness | | | | | | |
|---|---|---|---|---|---|---|---|
| | 6.20 μm | | | 6.90 μm | | | 7.60 μm |
| | Second portion height | | | | | | |
| | 0.20 μm | 0.30 μm | 0.40 μm | 0.20 μm | 0.30 μm | 0.40 μm | 0.40 μm |
| Times | 8 | 10 | 5 | 8 | 10 | 10 | 8 |
| Average | 2.7N | 2.7N | 2.6N | 2.3N | 2.4N | 2.6N | 2.6N |
| Standard deviation | 0.41 | 0.45 | 0.63 | 0.18 | 0.34 | 0.86 | 0.69 |

For reference, the test was performed in the state that the black pixel defining layer 380 of the first portion 385-1 had a height of 1.5 μm from the upper surface, respectively.

FIG. 17 shows that the average scratch strength of the seven embodiments is 2.6N, and Comparative Example 1 (Ref.1) of FIG. 16 shows that the average scratch strength is about 1.70 so that it may be easily checked how much improved it is.

Since the characteristic of the encapsulation layer 400 is to block the penetration of moisture or air from the outside, it may be appropriate for the thickness of the organic encapsulation layer 402 to be thick at a certain level, and the organic encapsulation layer 402 may be formed with a thickness of 6.9 μm, while the second portion 385-2 may be formed at 0.4 μm.

As above-described, it may be confirmed that the present embodiment basically has improved scratch strength by having higher scratch strength than Comparative Example 1 (Ref.1) and has improved scratch strength rather compared to Comparative Example 2 (Ref.2) according to an embodiment.

Hereinafter, the adherence characteristic of the present embodiment is described with reference to FIG. 18 to FIG. 21.

First, an adherence test method and a result thereof are described with reference to FIG. 18 and FIG. 19.

Figure 18:
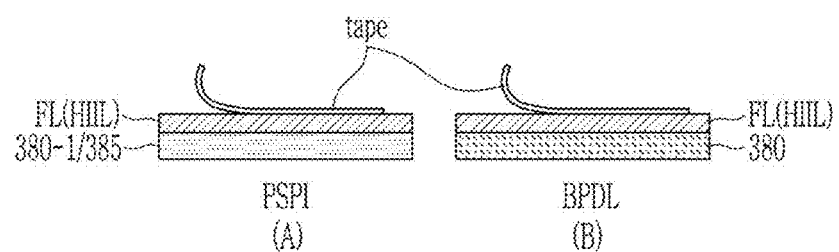

FIG. 18 and FIG. 19 are views showing a method of testing adherence and a result thereof.

FIG. 18 shows the method of conducting the adherence test, and two experimental examples (A) and (B) are shown to examine the adherence of the present embodiment.

First, in FIG. 18(A), the adherence between a photosensitive polyimide (PSPI) and a hole injection layer HIL among a functional layer FL is tested. Here, the photosensitive polyimide (PSPI) may form a spacer 385 of a pixel definition layer 380-1 of Comparative Example 2 (Ref.2) of FIG. 16.

On the other hand, in FIG. 18(B), the adherence between a black color organic material (BPDL) for a black pixel defining layer 380 instead of the photosensitive polyimide (PSPI) and a hole injection layer HIL of a functional layer FL is tested.

Here, the photosensitive polyimide (PSPI) or the black color organic material (BPDL) for the black pixel defining layer 380 may be stacked and then cured, then plasma-treated, and then the hole injection layer HIL may be stacked. After that, the adherence test is performed by a method of attaching a tape on the hole injection layer HIL positioned upward and detecting whether two layers fall apart while peeling it off.

Figure 20:
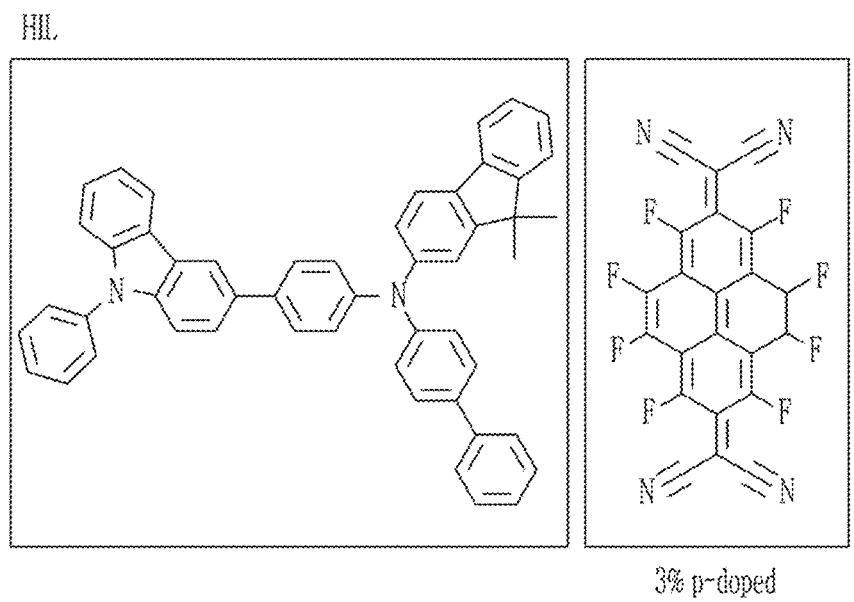
FIG. 20 is a view showing a chemical formula of a hole injection layer in a functional layer according to an embodiment.

Here, the hole injection layer HIL, as shown in FIG. 20, a p-doped hole injection layer HIL was used.

FIG. 19 shows pictures taken before and after the test for peeling off the tape in a table, and in FIG. 19, BPDL is a case including the black color organic material for the black pixel defining layer 380, there are a total of three experimental examples, and PSPI is a case including a photosensitive polyimide.

The three experimental examples (BPDL01, BPDL02, and BPDL03) including the black color organic material have the following differences.

Figure 21:
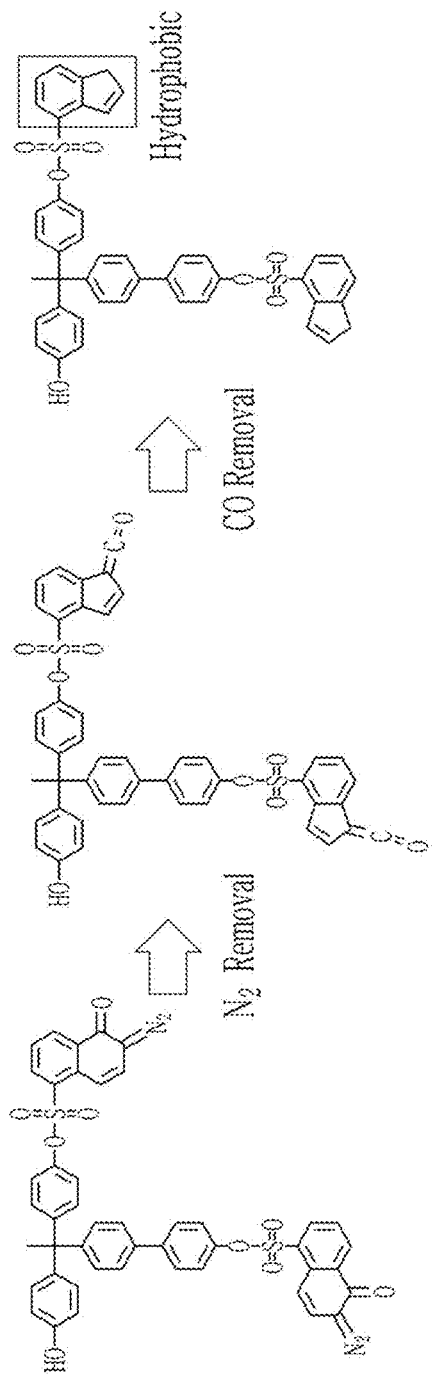
FIG. 21 is a view showing a characteristic change of a positive photosensitive material included in a comparative example.

BPDL01 is a case that only the black color organic material for the black pixel defining layer 380 is stacked, BPDL02 is a case that the PAC (positive active compound) material shown in FIG. 21 is added at 5 wt % to the black color organic material, and BPDL03 is a case that the PAC material at 10 wt % is added to the black color organic material.

In FIG. 19, the portion indicated by an arrow indicates the portion where the adhesion between two layers is separated, and the portion shown in a dot shape is the portion where the adhesion between two layers is separated.

As shown in FIG. 19, the black color organic material for the black pixel defining layer 380 does not have strong adherence with the hole injection layer HIL, so it may be confirmed that a portion with poor adhesion occurs in all three experimental examples. However, the photosensitive polyimide has strong adhesion with the hole injection layer HIL, so it may be confirmed that the adhesion does not fall even after the test.

As shown in FIG. 19, it may be confirmed that the adherence with the hole injection layer HIL was greatest when using the photosensitive polyimide, followed by BPDL03 with the second larger adherence, then BPDL02 with the third larger adherence, and BPDL01 with the lowest adherence.

Therefore, when the pixel definition layer is formed of the black color organic material without using a polarizer as in the present embodiment, the adhesion characteristic with the hole injection layer HIL formed thereon is not good, so the second portion 385-2 is additionally formed to reinforce the adhesion characteristic in forming the spacer 385. As a result, the area in which the black pixel defining layer 380 and the hole injection layer HIL are directly in contact with each other is reduced by covering the upper surface of the black pixel defining layer 380, and then the second portion 385-2 formed of the photosensitive polyimide and the hole injection layer HIL are in contact, thereby the adherence may be strengthened.

The difference in the adherence as described above is theoretically described with reference to FIG. 20 and FIG. 21.

FIG. 20 is a view showing a chemical formula of a hole injection layer in a functional layer according to an embodiment, and FIG. 21 is a view showing a characteristic change of a positive photosensitive material included in a comparative example.

According to FIG. 20, the hole injection layer has a P-HIL structure doped with about 3% of p in addition to a basic HIL material. The P-HIL structure has hydrophilicity.

On the other hand, FIG. 21 shows that a characteristic change as the positive photosensitive material included in the photosensitive polyimide is exposed.

That is, as nitrogen N2 and CO are removed, it finally has a hydrophilic characteristic.

Therefore, both the hole injection layer and the photosensitive polyimide have hydrophilicity, so their adherence is high.

In contrast, the black color organic material for the black pixel defining layer 380 may include carboxylic acid, and has a hydrophobic characteristic, so that the adhesion characteristic with the hole injection layer is not high.

Accordingly, to improve the adhesion characteristic with the hole injection layer HIL even while using the black pixel defining layer 380, the spacer 385 should have the second portion 385-2 with a low height (0.1 μm-0.5 μm) over a wide area, and the spacer 385 may be formed to cover the black pixel defining layer 380 with an area ratio of 50% or more and 95% or less, and according to an embodiment, it may be formed with an area ratio of 90%.

In the above, the structure of the spacer 385 with the black pixel defining layer 380 and the step in a normal pixel was described. Hereinafter, a structure of a spacer 385 in a pixel of a portion having a light transmission area LTA and including an optical element such as a camera or a light sensor thereunder while including a light transmission area LTA is described with reference to FIGS. 22, 23, 24, 25, 26, and 27.

A plurality of pixels and a plurality of spacers may be formed in a one-unit structure in the first element area DA2, and hereinafter, the structure of the unit pixel PXU2 positioned in the first element area DA2 is described.

Figure 22:
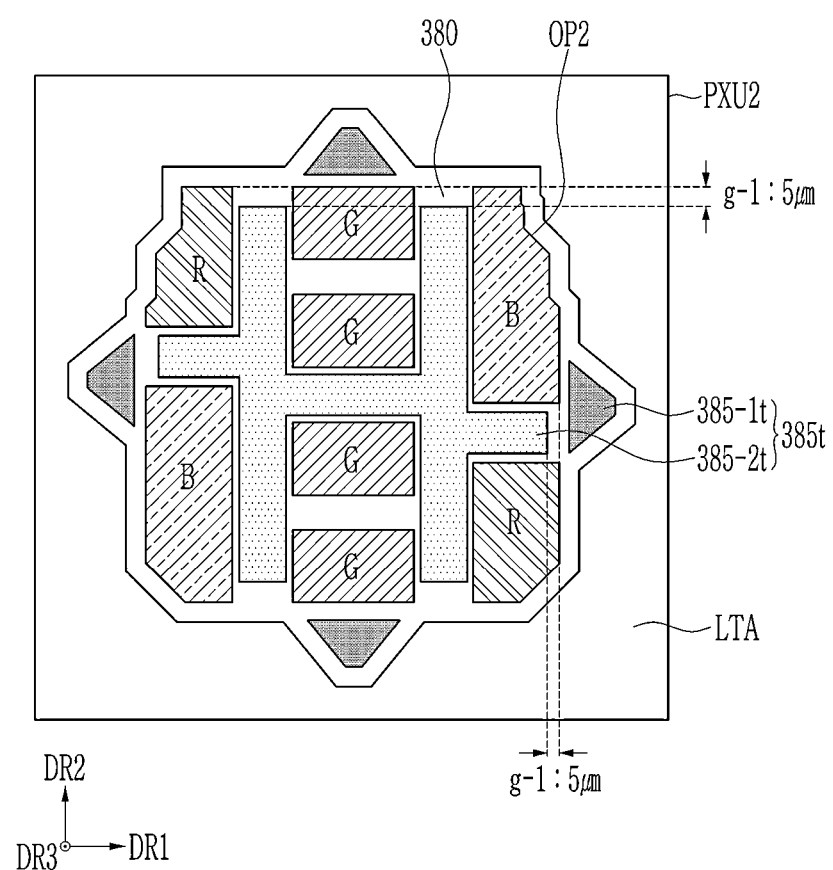
FIG. 22 is an enlarged top plan view showing a unit pixel positioned in a first element area and a periphery thereof in a light emitting display panel according to an embodiment.
Figure 23:
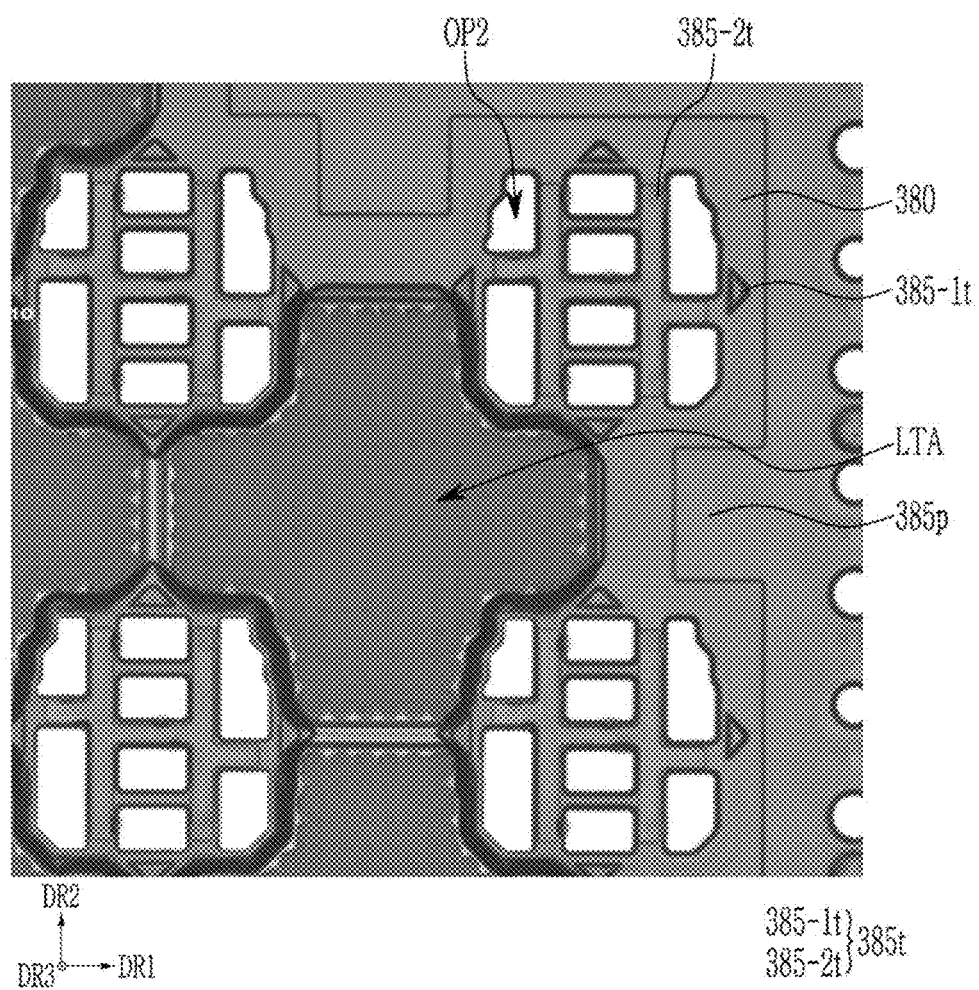
FIG. 23 is an enlarged view of a first element area according to an embodiment.
Figure 24:
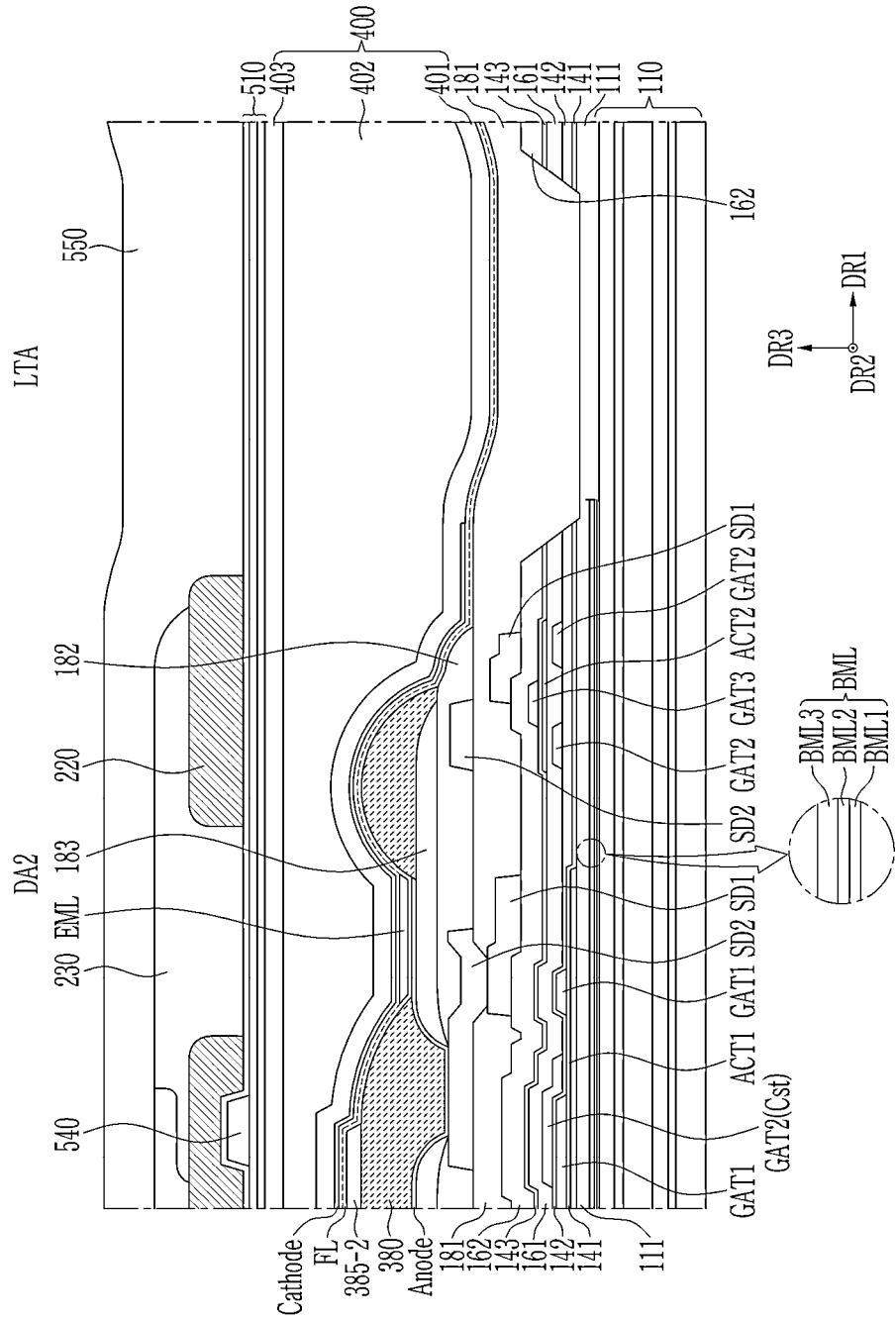
FIG. 24 is a cross-sectional view of a unit pixel and a light transmission area.

FIG. 22 is an enlarged top plan view showing a unit pixel positioned in a first element area and a periphery thereof in a light emitting display panel according to an embodiment, FIG. 23 is an enlarged view of a first element area according to an embodiment, and FIG. 24 is a cross-sectional view of a unit pixel and a light transmission area.

A planar structure of the unit pixel PXU2 positioned in the first element area DA2 is described with reference to FIG. 22 and FIG. 23.

A one-unit pixel PXU2 includes two red pixels, two blue pixels, and four green pixels, and also includes a plurality of light emitting diodes (LED). FIG. 22 does not show the pixel circuit unit of each pixel, and the light emitting diode (LED) of each color is shown by R, G, and B.

Two red light emitting diodes (LED) R, two blue light emitting diodes (LED) B, and four green light emitting diodes (LED) G are arranged in a rectangular area. Four green light emitting diodes (LED) G are arranged in the middle row, and the red light emitting diodes (LED) R and the blue light emitting diodes (LED) B are arranged alternately to the left and right. The light emitting diode (LED) positioned first in the left column and the light emitting diode (LED) positioned first in the right column may have different colors.

The spacer positioned in the first element area DA2 (hereinafter also referred to as a component spacer) includes a first component spacer 385-1t which is formed high and a second component spacer 385-2t which is formed low. The first component spacer 385-1t and the second component spacer 385-2t are separated from each other.

The first component spacer 385-1t may have the height corresponding to the first portion 385-1 of the main spacer 385 and may include the same material, and the second component spacer 385-2t may have the height corresponding to the second portion 385-2 of the main spacer 385 and may include the same material.

The component spacer positioned in the first element area DA2 is described in detail as follows.

The first component spacer 385-1t is positioned on the outside of the rectangular area including two red light emitting diodes (LED) R, two blue light emitting diodes (LED) B, and four green light emitting diodes (LED) G. In the embodiment of FIG. 22, the first component spacer 385-1t is positioned on the outside of one unit pixel PXU2 in four places on the top, bottom, left, and right, respectively, and when there is the portion where four first component spacers 385-1t are positioned, a rhombus structure may be formed. The material and height of the first component spacer 385-1t may be the same as that of the first portion 385-1 described in FIGS. 4, 5, 6, 7, 8, 9, 10, 11, 12, 13, 14, 15, 16, and 17. The first component spacer 385-1t may be formed of a positive type of organic material, and for example, a photosensitive polyimide (PSPI) may be used. The entire height of the first component spacer 385-1t may be about 1.5 μm, and depending on the embodiment, it may be 1.1 μm or more and 2.0 μm or less.

In one unit pixel PXU2, a black pixel defining layer 380 is formed corresponding to an area surrounding the unit pixel PXU2. The area where the black pixel defining layer 380 is positioned overlaps with the area occupied by a total of eight pixels and the area occupied by the first component spacer 385-1t of the periphery on a plane. An opening OP2 is defined in the black pixel defining layer 380. Referring to FIG. 23, the black pixel defining layer 380 may have a structure connected to the black pixel defining layer 380 of the adjacent unit pixel PXU2 by including portions extending vertically and horizontally. Referring to FIG. 23, the black pixel defining layer 380 is not formed in the area corresponding to the light transmission area LTA in addition to the opening OP2.

In FIG. 22, the outline of each light emitting diode (LED) R, G, and B is the opening OP2 positioned in the first element area DA2 of the black pixel defining layer 380, and corresponds to the area where the emission layer EML of the corresponding pixel is positioned. The size of the opening OP2 positioned in the first element area DA2 is related to the lifetime of the emission layer EML, and when the material of the emission layer EML is determined, the opening OP2 may be formed with a size set in consideration of the lifetime.

On the other hand, although the anode included in each light emitting diode (LED) R, G, and B is not shown, it includes the area of the opening OP2 of the black pixel defining layer 380 positioned in the first element area DA2, and an area additionally extended to the periphery and a portion that is extended and connected to the underlying pixel circuit unit.

On the black pixel defining layer 380, in addition to the first component spacer 385-1t, a second component spacer 385-2t is formed. In the first element area DA2, the first component spacer 385-1t and the second component spacer 385-2t are formed separately from each other.

The second component spacer 385-2t, as shown in FIG. 22, is positioned within the rectangular area where the eight light emitting diodes (LED) R, G, and B are positioned, and is positioned between the eight light emitting diodes (LED) R, G, and B. In addition, the second component spacer 385-2t is formed across the opening OP2 of the adjacent black pixel defining layer 380. The boundary of the opening OP2 of the black pixel defining layer 380 and the boundary of the second component spacer 385-2t do not coincide and are spaced apart from each other at a regular interval.

On the other hand, in the embodiment of FIG. 22, there is also a portion where the second component spacer 385-2t is not positioned between adjacent light emitting diodes (LED), and in this case, two adjacent light emitting diodes (LEDs) have the same color (in the embodiment of FIG. 22, green) may be displayed. The second component spacer 385-2t according to the embodiment of FIG. 22 may have an H-shape, and in addition to the H-shape, may have a structure protruded from side to side. According to an embodiment, the second component spacer 385-2t may be formed only in an H-shape.

In addition, the edge of the unit pixel PXU2 positioned outermost among the opening OP2 of the black pixel defining layer 380 and the edge of the second component spacer 385-2t adjacent thereto may have a horizontal interval of g-1. In the embodiment of FIG. 22, an interval of 5 µm is formed for each of a total of four edges, so that the second component spacer 385-2t may have a structure that is not protruded to the outside of the unit pixel PXU2 and is positioned inside.

The material and height of the second component spacer 385-2t may be the same as those of the second portion 385-2 described in FIG. 7, etc. The second component spacer 385-2t may be formed of the same material as the first component spacer 385-1t, and may be etched together through the same mask. The second component spacer 385-2t may be formed of a positive type of organic material, and for example, photosensitive polyimide (PSPI) may be used. The height of the second component spacer 385-2t may be about 0.4 µm, and may be 0.1 µm or more and 0.5 µm or less.

According to an embodiment, the first component spacer 385-1t and the second component spacer 385-2t may have a structure in which they are connected to each other.

Referring to FIG. 23, the light transmission area LTA is positioned between the four adjacent unit pixels PXU2, and the black pixel defining layer 380, the light emitting diode (LED), and the pixel circuit unit positioned below it are not formed so that light may be transmitted.

Hereinafter, the cross-section structure of the pixel and the light transmission area LTA of the first element area DA2 is described with reference to FIG. 24.

First, the cross-section structure of the pixel of the first element area DA2 is described.

Figure 28:
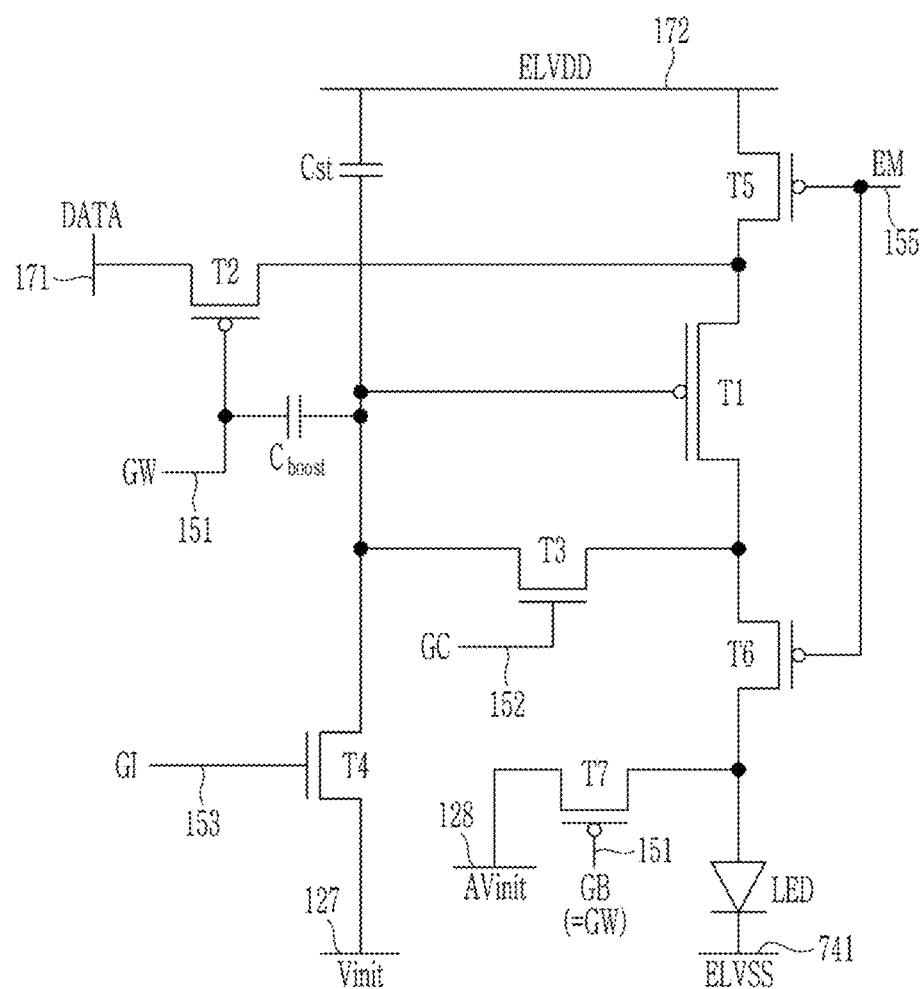
FIG. 28 is a circuit diagram of one pixel included in light emitting display panel according to an embodiment.

The pixel positioned in the first element area DA2 may have various embodiments, and may have the same circuit and cross-section structure as that of the pixel positioned in the first display area DA1. One example is shown in FIG. 28 described later and is described in FIG. 28 in detail, and FIG. 24 examines the relationship between the first element area DA2 and the light transmission area LTA focusing on each layer except for the specific connection relationship. The layered relationship of the first element area DA2 of FIG. 24 may be the same as the layered relationship of the first display area DA1.

The substrate 110 may include a material that does not bend due to a rigid characteristic such as glass or a flexible material that may be bent, such as plastic or polyimide. FIG. 24 shows a flexible substrate, and a structure in which polyimide and a barrier layer positioned thereon and formed of an inorganic insulating material are double formed.

A metal layer BML is positioned on the substrate 110 and may have a triple layer structure. That is, each pixel formed in the first display area and the first element area has a plurality of thin film transistors included in the pixel circuit unit, at least one thin film transistor of a plurality of thin film transistors has a top gate structure (a gate electrode is position on a semiconductor layer of which a channel of the thin film transistor is positioned), and the metal layer BML overlapping the semiconductor layer is formed under the semiconductor layer. However, the metal layer BML of the first display area may be formed of one layer formed of a metal, but the metal layer BML of the first element area additionally further includes the semiconductor layer BML1 and the inorganic insulating layer BML2 in addition to the layer BML3 corresponding to the metal layer BML of the first display area. Here, the semiconductor layer BML1 may include amorphous silicon, and the inorganic insulating layer BML2 may include a silicon oxide (SiO). In addition, each of the semiconductor layer BML1 and the inorganic insulating layer BML2 may be formed as thin as 130 Å.

The reason for additionally forming the semiconductor layer BML1 and the inorganic insulating layer BML2 is to block light reflection. That is, an optical element such as a camera may be positioned under the first element area DA2, and then a lens is positioned on the front of the optical element such as a camera, so that in order to remove a problem of being photographed by the camera while light is reflected between the lens and the metal layer BML3, the semiconductor layer BML1 and the inorganic insulating layer BML2 are thinly additionally formed.

The metal layer BML3 of the first element area DA2 may be formed of the same material as the metal layer BML of the first display area DA1, and may include a metal or a metal alloy such as copper (Cu), molybdenum (Mo), aluminum (Al), titanium (Ti), etc. and may consist of a single layer or multiple layers. In the present embodiment, the metal layer BML3 of the first element area DA2 may include molybdenum (Mo).

The metal layer BML is positioned in an area overlapping the channel of the first semiconductor layer ACT1 and/or the second semiconductor layer ACT2. The metal layer BML is also called a lower shielding layer or a light blocking layer.

On top of the metal layer BML, a buffer layer 111 covering the metal layer BML may be positioned, and the buffer layer serves to block the penetration of impurity elements into the first semiconductor layer, and may be an inorganic insulating layer such as a silicon oxide (SiOx) or a silicon nitride (SiNx), a silicon oxynitride (SiONx), and the like.

A first semiconductor layer ACT1 is positioned on the buffer layer 111. The first semiconductor layer ACT1 includes a channel area, and a first area and a second area positioned on both sides of the channel area.

The first gate insulating layer 141 may be positioned to cover the first semiconductor layer ACT1 or to overlap only the channel area of the first semiconductor layer ACT1. That is, the first gate insulating layer 141 does not overlap the second semiconductor layer ACT2. The first gate insulating layer 141 may be an inorganic insulating layer including a silicon oxide (SiOx), a silicon nitride (SiNx), a silicon oxynitride (SiONx), or the like.

A first gate conductive layer GAT1 is positioned on the first gate insulating layer 141, and the first gate conductive layer GAT1 includes a gate electrode of a transistor (LTPS TFT) including a silicon semiconductor. The first gate conductive layer GAT1 may include a metal such as copper (Cu), molybdenum (Mo), aluminum (Al), titanium (Ti), or a metal alloy, and may be configured as a single layer or multiple layers. An area overlapping the gate electrode on a plane among the first semiconductor layer ACT1 may be a channel area.

The first gate conductive layer GAT1 is covered by a second gate insulating layer 142, and the second gate insulating layer 142 may be an inorganic insulating layer including a silicon oxide (SiOx), a silicon nitride (SiNx), a silicon oxynitride (SiONx), or the like.

The second gate conductive layer GAT2 is positioned on the second gate insulating layer 142, and the second gate conductive layer GAT2 includes a first storage electrode configuring the storage capacitor with the gate electrode and the lower shielding layer for the oxide semiconductor transistor positioned under the oxide semiconductor layer ACT2. The second gate conductive layer GAT2 may include a metal or a metal alloy such as copper (Cu), molybdenum (Mo), aluminum (Al), or titanium (Ti), and may be configured of a single layer or multiple layers.

The second gate conductive layer GAT2 is covered by a first interlayer insulating layer 161, and the first interlayer insulating layer 161 may include an inorganic insulating layer including a silicon oxide (SiOx), a silicon nitride (SiNx), a silicon oxynitride (SiONx), etc.

An oxide semiconductor layer ACT2 is positioned on the first interlayer insulating layer 161, and the oxide semiconductor layer ACT2 includes a channel area, and a first area and a second area positioned on both sides of the channel area.

The oxide semiconductor layer ACT2 is covered by a third gate insulating layer 143, and the third gate insulating layer 143 may include an inorganic insulating layer including a silicon oxide (SiOx), a silicon nitride (SiNx), a silicon oxynitride (SiONx), etc.

A third gate conductive layer GAT3 is positioned on the third gate insulating layer 143. The third gate conductive layer GAT3 may include a metal or a metal alloy such as copper (Cu), molybdenum (Mo), aluminum (Al), or titanium (Ti), and may be composed of a single layer or multiple layers.

The third gate conductive layer GAT3 is covered by a second interlayer insulating layer 162, and the second interlayer insulating layer 162 may include an inorganic insulating layer including a silicon oxide (SiOx), a silicon nitride (SiNx), a silicon oxynitride (SiONx), etc., and according to an embodiment, it may include an organic material.

A first data conductive layer SD1 is positioned on the second interlayer insulating layer 162, and the first data conductive layer SD1 includes a connecting part, thereby having a function for providing a voltage or a current to the first semiconductor layer ACT1 and the oxide semiconductor layer ACT2 or for transmitting a voltage or a current to other elements. The first data conductive layer SD1 may include a metal such as aluminum (Al), copper (Cu), molybdenum (Mo), titanium (Ti), or a metal alloy, and may be configured as a single layer or multiple layers.

The first data conductive layer SD1 is covered by a first organic layer 181. The first organic layer 181 may be an organic insulator including an organic material, and the organic material may include at least one material selected from the group consisting of polyimide, polyamide, acryl resin, benzocyclobutene, and phenol resin.

A second data conductive layer SD2 is positioned on the first organic layer 181. The second data conductive layer SD2 may be connected to the first data conductive layer SD1 through an opening penetrating the first organic layer 181. The second data conductive layer SD2 may include a metal or a metal alloy such as aluminum (Al), copper (Cu), molybdenum (Mo), or titanium (Ti), and may be configured as a single layer or multiple layers.

The second data conductive layer SD2 is covered by a second organic layer 182. The second organic layer 182 may be an organic insulator, and may include at least one material selected from the group consisting of polyimide, polyamide, acryl resin, benzocyclobutene, and phenol resin.

A third organic layer 183 may be positioned on the second organic layer 182, and may include at least one material selected from the group consisting of polyimide, polyamide, acryl resin, benzocyclobutene, and phenol resin. According to an embodiment, the third organic layer 183 may not be included.

The organic layer 180 shown in FIG. 7 etc. may be one of the first organic layer 181, the second organic layer 182, and the third organic layer 183, and in the embodiment of FIG. 21, the organic layer 180 may correspond to the third organic layer 183.

The anode (Anode) is positioned on the third organic layer 183. The anode (Anode) is connected to the second data conductive layer SD2 and the first data conductive layer SD1 through the opening positioned in the third organic layer 183 and/or the second organic layer 182 to receive the output current from the transistor of the pixel circuit unit. The anode (Anode) may be composed of a single layer including a transparent conductive oxide film and a metal material, or a multi-layer including these. The transparent conductive oxide layer may include Indium Tin Oxide (ITO), poly-ITO, Indium Zinc Oxide (IZO), Indium Gallium Zinc Oxide (IGZO) and Indium Tin Zinc Oxide (ITZO), and the metal material may include silver (Ag), molybdenum (Mo), copper (Cu), gold (Au), and aluminum (Al).

On top of the anode, a black pixel defining layer 380 having an opening overlapping with at least part of the anode and covering the portion of the rest of the anode (Anode) is positioned. The black pixel defining layer 380 may further include a light blocking material in addition to the organic insulating material. The light blocking material includes carbon black, carbon nanotubes, a resin or paste including a black dye, metal particles such as nickel, aluminum, molybdenum, and alloys thereof, metal oxide particles (e.g., chromium nitride), etc. The black pixel defining layer 380 may be formed of an organic material having a negative type of black color. Since the negative type of organic material is used, it may have a characteristic that the portion covered by the mask is removed.

An opening is defined in the black pixel defining layer 380, and the emission layer EML is positioned within the opening. The emission layer EML may be formed of an organic light emitting material, and the adjacent emission layer EMLs may display different colors. On the other hand, according to an embodiment, each emission layer EML may display light of the same color due to the overlying color filter 230.

A spacer 385 is formed on the black pixel defining layer 380, but FIG. 21 shows only the second spacer 385-2. However, on the black pixel defining layer 380, as shown in FIG. 20, in addition to the second spacer 385-2, a first spacer 385-1 separated from the second spacer 385-2 is also formed.

A functional layer FL is positioned on the spacer 385 and the exposed black pixel defining layer 380, and the functional layer FL may be formed on the entire surface of the display panel DP. The functional layer FL may include an electron injection layer, an electron transport layer, a hole transport layer, and a hole injection layer, and may be disposed on and under the emission layer EML. That is, as the hole injection layer, the hole transport layer, the emission layer EML, the electron transport layer, the electron injection layer, and the cathode (Cathode) are sequentially positioned on the anode (Anode), among the functional layer FL, the hole injection layer and the hole transport layer may be disposed under the emission layer EML, and the electron transport layer and the electron injection layer may be disposed on the emission layer EML.

The cathode may be formed as a light-transmitting electrode or a reflecting electrode. According to an embodiment, the cathode may be a transparent or semi-transparent electrode, and may be formed of a metal thin film having a small work function, including lithium (Li), calcium (Ca), lithium fluoride/calcium (LiF/Ca), lithium fluoride/aluminum (LiF/Al), aluminum (Al), silver (Ag), magnesium (Mg), and a compound thereof. In addition, a transparent conductive oxide (TCO) such as Indium Tin Oxide (ITO), Indium Zinc Oxide (IZO), zinc oxide (ZnO) or indium oxide (In2O3) may be further disposed on the metal thin film. The cathode may be integrally formed over the entire surface of the display panel DP except for the light transmission area LTA.

An encapsulation layer 400 is positioned on the cathode (Cathode). The encapsulation layer 400 includes at least one inorganic layer and at least one organic layer, and in FIG. 24, it has a triple layer structure including the first inorganic encapsulation layer 401, the organic encapsulation layer 402, and the second inorganic encapsulation layer 403. The encapsulation layer 400 may be to protect the emission layer EML formed of an organic material from moisture or oxygen that may be inflowed from the outside. According to an embodiment, the encapsulation layer 400 may include a structure in which an inorganic layer and an organic layer are sequentially further stacked.

A detecting insulating layer 510 and a detecting electrode 540 are positioned on the encapsulation layer 400 for touch sensing. In FIG. 24, only one detecting electrode 540 is shown, however as shown in FIG. 1, two detecting electrodes may be included. Here, the detecting electrode 540 may include a metal or a metal alloy such as aluminum (Al), copper (Cu), silver (Ag), gold (Au), molybdenum (Mo), titanium (Ti), or tantalum (Ta), and may be composed of a single layer or multiple layers.

A light blocking layer 220 and a color filter 230 are positioned on the overlying detecting electrode 540.

The light blocking layer 220 may be positioned so as to overlap the detecting electrode 540 in a plane view and may be positioned so as to not overlap the anode (Anode) in a plane view. This is to prevent the anode (Anode) and the emission layer EML capable of displaying the image from being obscured by the light blocking layer 220 and the detecting electrode 540.

The color filter 230 is positioned on the detecting insulating layer 510 and the light blocking layer 220. The color filter 230 includes a red color filter that transmits red light, a green color filter that transmits green light, and a blue color filter that transmits blue light. Each color filter 230 may be positioned so as to overlap with the anode (Anode) of a light emitting diode (LED) on a plane. Since light emitted from the emission layer EML may be emitted while being changed into a corresponding color while passing through the color filter, all of the light emitted from the emission layer EML may have the same color. However, in the emission layer EML, different colors of light are displayed, and the displayed color sense may be enhanced by passing through the color filter of the same color.

The light blocking layer 220 may be respectively positioned between the color filters 230. That is, the two color filters 230 are spaced apart from each other along the first direction DR1. According to an embodiment, the color filter 230 may be replaced with a color conversion layer or may further include a color conversion layer. The color conversion layer may include quantum dots.

A planarization layer 550 covering the color filter 230 and the light blocking layer 220 is positioned on the color filter 230. The planarization layer 550 is for planarizing the upper surface of the light emitting display panel, and may be a transparent organic insulator including at least one material selected from the group consisting of polyimide, polyamide, acryl resin, benzocyclobutene, and phenol resin.

According to an embodiment, a low refractive layer and an additional planarization layer may be further positioned on the planarization layer 550 to improve the front visibility and light output efficiency of the display panel. Light may be emitted while being refracted to the front by the low refractive layer and the additional planarization layer having a high refractive characteristic.

In the present embodiment, the polarizer is not included on the planarization layer 550. That is, the polarizer may serve to prevent the display deterioration while the user recognizes the external light as it is incident and reflected from the anode and the like. However, in the present embodiment, the black pixel defining layer 380 covers the side of the anode (Anode) to reduce the degree of the reflection from the anode (Anode), and the light blocking layer 220 is also formed to reduce the incidence of light, thereby the structure to prevent the deterioration of the display quality due to the reflection is already included. Therefore, there is no need to separately from the polarizer on the front of the display panel DP.

In the above, the stacking relationship of the pixels in the first element area DA2 was described. Hereinafter, the stacking relationship of the light transmission area LTA among the first element area DA2 is described.

The light transmission area LTA removes the semiconductor, the metal, the light blocking layer 220, the color filter 230, and the black pixel defining layer 380 so that light may be transmitted without blocking, and is laminated with only a transparent material. Transparent materials include an inorganic insulating layer or an organic insulating layer, and may additionally include a functional layer FL. The structure in which the inorganic insulating layer or the organic insulating layer is stacked on the light transmission area LTA may be varied, and the stacked structure of the light transmission area LTA according to the embodiment of FIG. 24 is as follows.

A buffer layer 111 is positioned on the flexible substrate 110 including polyimide and a barrier layer, and a first organic layer 181 is formed on the buffer layer 111. The functional layer FL is positioned on the first organic layer 181, and the encapsulation layer 400 is positioned directly thereon. The upper layered structure of the encapsulation layer 400 may be the same as the layer stacked on the pixel of the first element area DA2 except for the detecting electrode 540, the light blocking layer 220, and the color filter 230. That is, the detecting insulating layer 510 and the planarization layer 550 may be positioned on the encapsulation layer 400 in the light transmission area LTA. According to an embodiment, on the planarization layer 550 of the light transmission area LTA, a low refractive layer and an additional planarization layer may be further positioned to improve the front visibility and light output efficiency of the display panel.

In the pixel of the first element area DA2, the layer (the first gate insulating layer 141, the second gate insulating layer 142, the first interlayer insulating layer 161, the third gate insulating layer 143, and the second interlayer insulating layer 162) stacked under the first organic layer 181 has been removed. However, according to an embodiment, at least one of these insulating layers may not be removed.

In addition, the second organic layer 182 and the third organic layer 183 positioned on the first organic layer 181 in the pixel of the first element area DA2 are removed. However, according to an embodiment, at least one of these organic layers may not be removed.

In addition, the cathode (Cathode) positioned on the functional layer FL is also removed, and additionally, the light blocking layer 220, the color filter 230, and the black pixel defining layer 380 are also removed.

In the above, the structure of the unit pixel PXU2, the spacer 385, and the light transmission area LTA in the first element area DA2 was described.

Hereinafter, the structure of the spacer 385 on the boundary portion of the first display area DA1 and the first element area DA2 is described with reference to FIG. 25 and FIG. 26.

Figure 25:
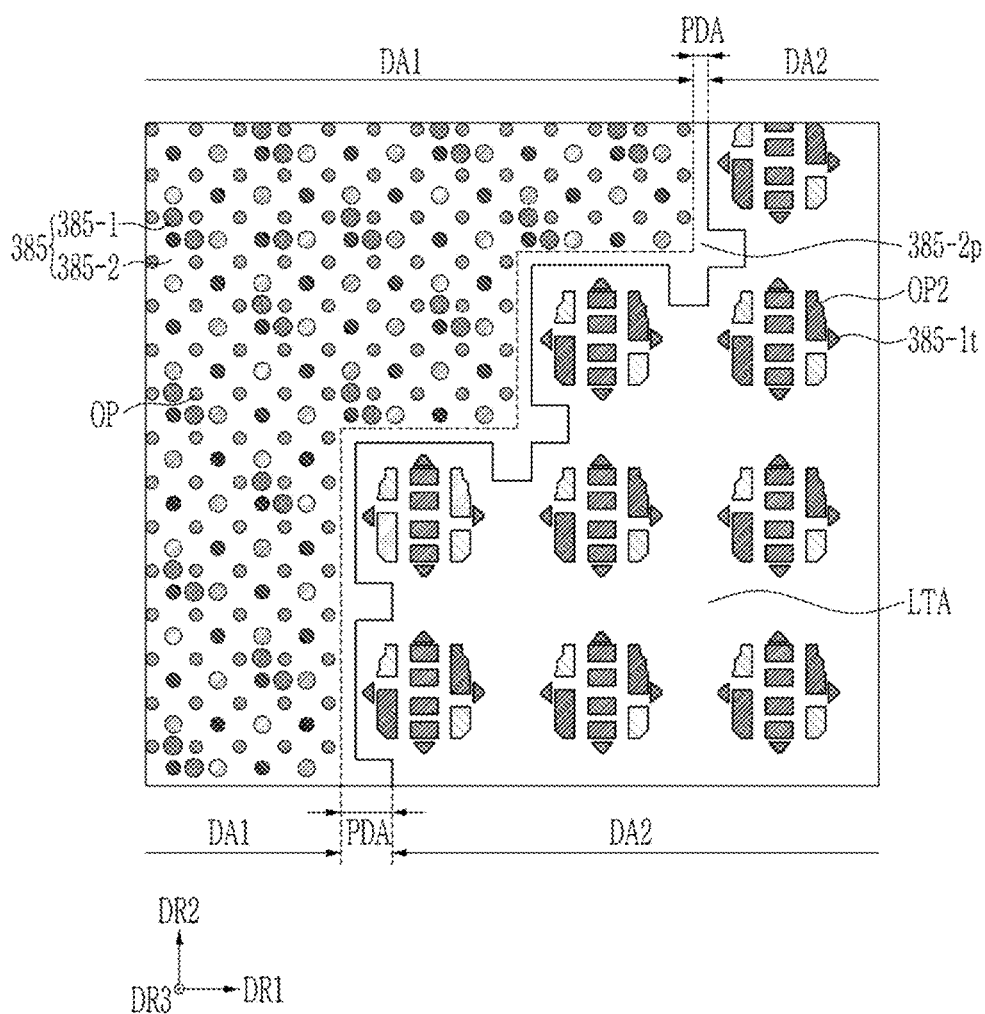
FIG. 25 is a top plan view schematically showing a first display area and a first element area in a light emitting display panel according to an embodiment.
Figure 26:
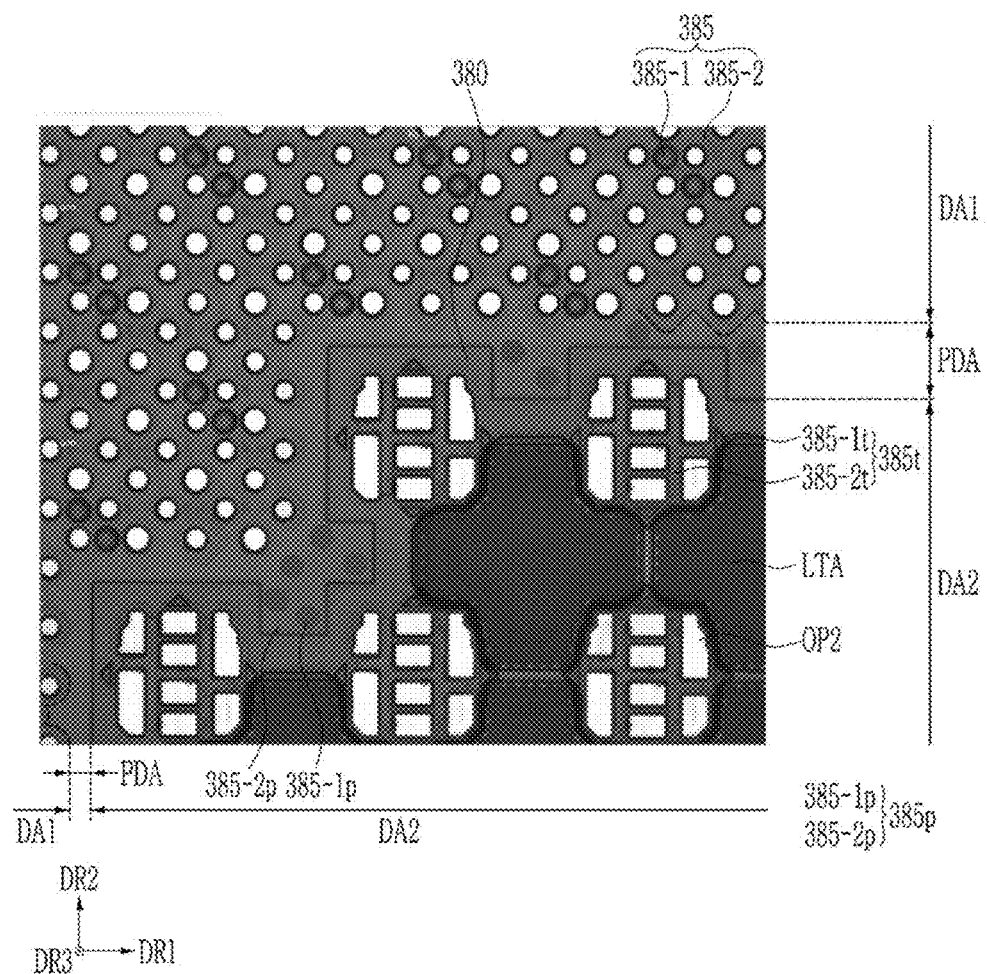
FIG. 26 is an enlarged view taken a first display area and a first element area according to an embodiment.

FIG. 25 is a top plan view schematically showing a first display area and a first element area in a light emitting display panel according to an embodiment, and FIG. 26 is an enlarged view of a first display area and a first element area according to an embodiment.

FIG. 25 shows the structure of openings OP and OP2 of the black pixel defining layer 380 and the spacer 385 in the first display area DA1 and the first element area DA2.

As shown in FIG. 25, the openings OP and OP2 of the black pixel defining layer 380 have different sizes in the first display area DA1 and the first element area DA2, and the size of the opening OP2 formed in the first element area DA2 is larger than the size of the opening OP formed in the first display area DA1. This is to make up for the reduction in the number of pixels due to the light transmission area LTA by largely forming the light emitting diode (LED). In the opening OP of the first display area DA1 and in the opening OP2 of the first element area DA2, each of red, green, and blue emission layers are respectively positioned, and in FIG. 25, the colors are distinguished through hatching. However, the arrangement of the colors may vary according to an embodiment.

In FIG. 25, the first portion 385-1 of the first display area DA1 is shown as a circle, and the second portion 385-2 of the first display area DA1 is positioned on the periphery thereof. The second portion 385-2 may be positioned at a predetermined distance from the opening OP of the first display area DA1, and as shown in FIG. 9, it may be formed entirely except for the opening OP and a portion exposing some black pixel defining layer 380 in the first display area DA1.

On the other hand, in FIG. 25, the first component spacer 385-1t of the first element area DA2 is shown by a relatively large triangle, and in FIG. 25, the second component spacer 385-2t of the first element area DA2 is not shown. However, the second component spacer 385-2t of the first element area DA2 may be formed in the same shape and position as that of FIG. 22.

The black pixel defining layer 380 is formed as a whole except for the light transmission area LTA and the openings OP and OP2 so that the black pixel defining layer 380 is positioned over the first display area DA1, the first element area DA2, and the boundary area PDA positioned between the first display area DA1 and the first element area DA2. According to an embodiment, the black pixel defining layer 380 is formed in an island-shaped structure in the first element area DA2 and may be positioned apart from the adjacent black pixel defining layer 380.

The opening OP and OP2 is not formed in the black pixel defining layer 380 positioned in the boundary area PDA positioned between the first display area DA1 and the first element area DA2, and the portion where the black pixel defining layer 380 is not formed in the first element area DA2 may be the light transmission area LTA. Among the boundary area PDA between the first display area DA1 and the first element area DA2, a boundary portion spacer 385p is formed on the black pixel defining layer 380. In the boundary portion spacer 385p according to the embodiment of FIG. 25, only the second boundary portion spacer 385-2p having the lower height is formed. In FIG. 25, the second boundary portion spacer 385-2p is positioned in the boundary area PDA as a whole and is connected to the second portion 385-2 of the first display area DA1, and the end of the second boundary portion spacer 385-2p may have a tapered structure at the boundary with the light transmission area LTA of the first element area DA2. That is, the boundary portion spacer 385p has a constant height and includes a second boundary portion spacer 385-2p having a tapered structure toward the first element area DA2.

In addition, the material and height of the boundary portion spacer 385p may be the same as that of the second portion 385-2 shown in FIG. 7 and the like. The boundary portion spacer 385p may be formed of a positive type of organic material, and as one example, the photosensitive polyimide (PSPI) may be used. The height of the second boundary portion spacer 385-2p may be about 0.4 µm, and may be 0.1 µm or more and 0.5 µm or less. However, according to an embodiment, the boundary portion spacer 385p may be formed to be larger or smaller than the spacer 385 of the first display area DA1.

In FIG. 26, unlike FIG. 25, the structure in which the boundary portion spacer 385p also includes the first boundary portion spacer 385-1p having the higher height than the second boundary portion spacer 385-2p is shown. The first portion 385-1 and the first boundary portion spacer 385-1p of the first display area DA1 are shown as a circle.

The boundary portion spacer 385p according to the embodiment of FIG. 26 includes a first boundary portion spacer 385-1p and a second boundary portion spacer 385-2p.

The second boundary portion spacer 385-2p is positioned in the boundary area PDA as a whole and is connected to the second portion 385-2 of the first display area DA1, and at the boundary with the first element area DA2, the end of the second boundary portion spacer 385-2p may have the tapered structure.

The first boundary portion spacer 385-1p of the boundary portion spacer 385p, as shown in FIG. 26, may be positioned sparsely and have the higher height than the second boundary portion spacer 385-2p. In the present embodiment, the boundary portion spacer 385p may have the same size and shape as the spacer 385 of the first display area DA1. As a result, the cross-section structure of the boundary portion spacer 385p may be referred to as a spacer 385 shown in FIG. 2. That is, the boundary portion spacer 385p has a constant height and may include a first boundary portion spacer 385-1p having the higher height than the second boundary portion spacer 385-2p along with the second boundary portion spacer 385-2p having the taper structure toward the first element area DA2.

In addition, the material and height of the boundary portion spacer 385p maybe the same as the spacer 385 described in FIGS. 7, 8, 9, 10, 11, 12, 13, 14, 15, 16, and 17. The boundary portion spacer 385p may be formed of a positive type of organic material, and for example, the photosensitive polyimide (PSPI) may be used. The entire height of the first boundary portion spacer 385-1p may be about 1.5 µm, and may be 1.1 µm or more and 2.0 µm or less. In addition, the second boundary portion spacer 385-2p may have a height of about 0.4 µm, and may be 0.1 µm or more and 0.5 µm or less. However, according to an embodiment, the boundary portion spacer 385p may be formed larger or smaller than the spacer 385 of the first display area DA1. Meanwhile, according to an embodiment, the first boundary portion spacer 385-1p may have the lower height than the first portion 385-1 of the first display area DA1.

Hereinafter, the scratch strength of the first element area DA2 is described with reference to FIG. 27.

Figure 27:
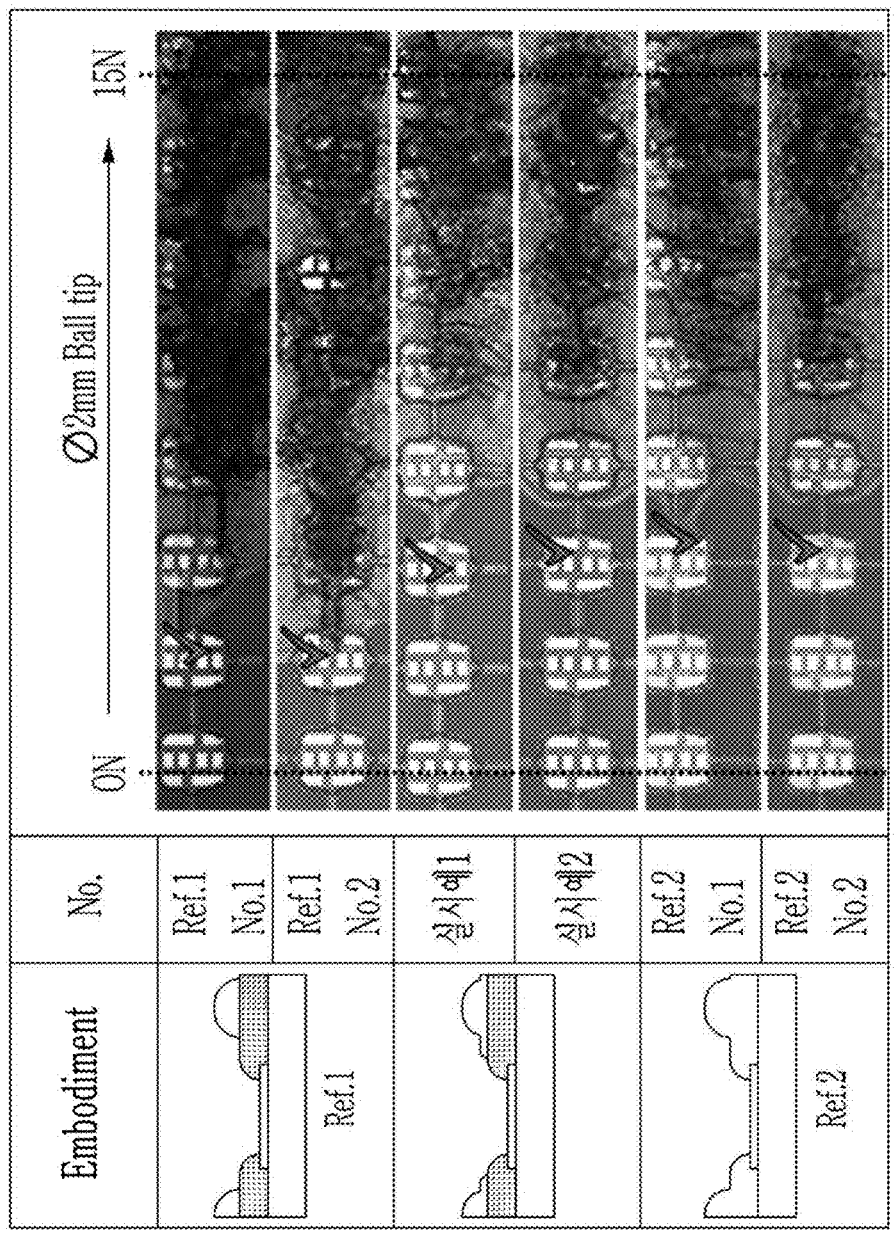
FIG. 27 is a view showing a comparison of scratch strength of a first element area according to an embodiment and a comparative example.

FIG. 27 is a view showing a comparison of scratch strength of a first element area according to an embodiment and a comparative example.

In FIG. 27, as a comparative example, a first comparative example Ref.1 and a second comparative example Ref.2 are described and have the same characteristic as two comparative examples Ref. 1 and Ref. 2 described in FIG. 16. However, in FIG. 27, the scratch strength is compared by using two comparative examples for each of comparative examples Ref.1 and Ref.2. In FIG. 27, for the structure of the present embodiment, two embodiments (Embodiment 1, Embodiment 2) are also included.

In FIG. 27, two embodiments (Embodiment 1, Embodiment 2) are embodiments generated through the same process conditions as each other. Also, two comparative examples included in the comparative examples Ref.1 and Ref.2 are formed through the same process conditions.

The scratch strength test of FIG. 27 was conducted while sequentially applying a pressure using an instrument with a ball tip diameter of 2 mm.

In FIG. 27, the position where the unit pixel is defective with respect to the scratch strength in the first element area DA2 is shown with a check mark, and a crack load value at the position where the defect occurs is also described.

By comparison, it may be confirmed that the second comparative example Ref.2 has the highest scratch strength. However, since the second comparative example Ref.2 does not use the black pixel defining layer 380, there is a drawback that a separate polarizer must be attached to reflect the external light. In addition, in terms of the scratch strength, it may be confirmed that the embodiment does not significantly decrease compared to the second comparative example Ref.2.

Meanwhile, comparing the first comparative example Ref. 1 using the black pixel defining layer 380 with the embodiment, it may be confirmed that there is a significant difference in the scratch strength. As a result, like the present embodiment, in forming the second portion 385-2 overlapping with the wide area on the black pixel defining layer 380 compared to the first comparative example Ref.1 forming the high first portion only in the narrow area, the scratch strength is high enough, and it has a merit that an inferiority rate is reduced.

Hereinafter, the circuit structure of the pixel is described with reference to FIG. 28.

First, the circuit structure of one pixel is described through FIG. 28.

FIG. 28 is a circuit diagram of one pixel included in light emitting display panel according to an embodiment.

The circuit structure shown at FIG. 28 is a circuit structure of a pixel circuit unit and a light emitting diode (LED) formed in the first display area DA1 and the first element area DA2.

One pixel according to an embodiment includes a plurality of transistors T1, T2, T3, T4, T5, T6, and T7, a storage capacitor Cst, a boost capacitor $C_{boost}$ and a light emitting diode (LED) that are connected to several wires 127, 128, 151, 152, 153, 155, 171, 172, and 741. Here, the transistors and capacitor excluding the light emitting diodes LED constitute a pixel circuit unit. According to an embodiment, the boost capacitor $C_{boost}$ may be omitted.

A plurality of wires 127, 128, 151, 152, 153, 155, 171, 172, and 741 are connected to one pixel PX. A plurality of wires include a first initialization voltage line 127, a second initialization voltage line 128, a first scan line 151, a second scan line 152, an initialization control line 153, a light emitting control line 155, a data line 171, a driving voltage line 172, and a common voltage line 741. In the embodiment of FIG. 28, the first scan line 151 connected to the seventh transistor T7 is also connected to the second transistor T2, according to an embodiment, and the seventh transistor T7 may be connected with a separate bypass control line differently from the second transistor T2.

The first scan line 151 is connected to a scan driver (not shown) to transmit a first scan signal GW to the second transistor T2 and the seventh transistor T7. A voltage of an opposite polarity to a voltage applied to the first scan line 151 may be applied to the second scan line 152 with the same timing as the signal of the first scan line 151. For example, when a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4. The light emission control line 155 transmits a light emission control signal EM to the fifth transistor T5 and the sixth transistor T6.

The data line 171 is a wire transmitting a data voltage DATA generated from a data driver (not shown), and accordingly a luminance emitted by the light emitting diode (LED) is changed as a magnitude of the light emitting current transmitted to the light emitting diode LED is changed. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to the cathode of the light emitting diode LED. In the present exemplary embodiment, the voltages applied to the driving voltage line 172, the first and second initialization voltage lines 127 and 128, and the common voltage line 741 may be a constant voltage, respectively.

The driving transistor T1 (also referred to as a first transistor) is a p-type transistor and has a silicon semiconductor as a semiconductor layer. It is a transistor that adjusts the magnitude of the light emitting current output to the anode of the light emitting diode LED according to the magnitude of the voltage (i.e., a voltage stored in the storage capacitor Cst) of the gate electrode of the driving transistor T1. Since the brightness of the light emitting diode LED is adjusted according to the magnitude of the light emitting current output to the anode of the light emitting diode LED, the light emitting luminance of the light emitting diode LED may be adjusted according to the data voltage DATA applied to the pixel. For this purpose, the first electrode of the driving transistor T1 is disposed to receive the driving voltage ELVDD and is connected to the driving voltage line 172 via the fifth transistor T5. Also, the first electrode of the driving transistor T1 is connected to the second electrode of the second transistor T2 to receive the data voltage DATA. On the other hand, the second electrode of the driving transistor T1 outputs the light emitting current to the light emitting diode LED and is connected to the anode of the light emitting diode LED via the sixth transistor T6 (hereinafter, referred to as an output control transistor). In addition, the second electrode of the driving transistor T1 is also connected to the third transistor T3 to transmit the data voltage DATA applied to the first electrode to the third transistor T3. Meanwhile, the gate electrode of the driving transistor T1 is connected to one electrode (hereinafter, referred to as a second storage electrode) of the storage capacitor Cst. Accordingly, the voltage of the gate electrode of the driving transistor T1 changes according to the voltage stored in the storage capacitor Cst, and accordingly, the light emitting current output by the driving transistor T1 is changed. The storage capacitor Cst serves to keep the voltage of the gate electrode of the driving transistor T1 constant for one frame. Meanwhile, the gate electrode of the driving transistor T1 may also be connected to the third transistor T3 so that data voltage DATA applied to the first electrode of the driving transistor T1 may be transmitted to the gate electrode of the driving transistor T1 through the third transistor T3. The gate electrode of the driving transistor T1 is also connected to the fourth transistor T4 and may be initialized by receiving the first initialization voltage Vinit.

The second transistor T2 is a p-type transistor and has a silicon semiconductor as a semiconductor layer. The second transistor T2 is a transistor that receives the data voltage DATA into the pixel. The gate electrode of the second transistor T2 is connected to the first scan line 151 and one electrode (hereinafter, referred to as 'a lower boost electrode') of the boost capacitor $C_{boost}$. The first electrode of the second transistor T2 is connected to the data line 171. The second electrode of the second transistor T2 is connected to the first electrode of the driving transistor T1. When the second transistor T2 is turned on by the negative voltage of the first scan signal GW transmitted through the first scan line 151, the data voltage DATA transmitted through the data line 171 is transmitted to the first electrode of the driving transistor T1 and the data voltage DATA is finally transmitted to the gate electrode of the driving transistor T1 and stored in the storage capacitor Cst.

The third transistor T3 is an n-type transistor and has an oxide semiconductor as a semiconductor layer. The third transistor T3 is electrically connected to the second electrode of the driving transistor T1 and the gate electrode of the driving transistor T1. As a result, it is a transistor that allows the data voltage DATA to be compensated by the threshold voltage of the driving transistor T1 and then stored in the second storage electrode of the storage capacitor Cst. The gate electrode of the third transistor T3 is connected to the second scan line 152, and the first electrode of the third transistor T3 is connected to the second electrode of the driving transistor T1. The second electrode of the third transistor T3 is connected to the second storage electrode of the storage capacitor Cst, the gate electrode of the driving transistor T1, and the other electrode of the boost capacitor $C_{boost}$ (hereinafter, referred to as 'an upper boost electrode'). The third transistor T3 is turned on by the positive voltage among the second scan signal GC transmitted through the second scan line 152 to connect the gate electrode of the driving transistor T1 and the second electrode of the driving transistor T1 and to transmit the voltage applied to the gate electrode of the driving transistor T1 to the second storage electrode of the storage capacitor Cst to be stored to the storage capacitor Cst. At this time, the voltage stored in the storage capacitor Cst is stored in a state in which the voltage of the gate electrode of the driving transistor T1 when the driving transistor T1 is turned off is stored, and then the voltage of the threshold voltage Vth of the driving transistor T1 is compensated.

The fourth transistor T4 is an n-type transistor and has an oxide semiconductor as a semiconductor layer. The fourth transistor T4 initializes the gate electrode of the driving transistor T1 and the second storage electrode of the storage capacitor Cst. The gate electrode of the fourth transistor T4 is connected to the initialization control line 153, and the first electrode of the fourth transistor T4 is connected to the first initialization voltage line 127. The second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by the positive voltage of the initialization control signal GI received through the initialization control line 153, and at this time, the first initialization voltage Vinit is transmitted to the gate electrode of the driving transistor T1, the second storage electrode of the storage capacitor Cst, and the upper boost electrode of the boost capacitor $C_{boost}$ to be initialized.

The fifth transistor T5 and the sixth transistor T6 are p-type transistors, and have a silicon semiconductor as a semiconductor layer.

The fifth transistor T5 serves to transfer the driving voltage ELVDD to the driving transistor T1. The gate electrode of the fifth transistor T5 is connected to the light emitting control line 155, the first electrode of the fifth transistor T5 is connected to the driving voltage line 172, and the second electrode of the fifth transistor T5 is connected to the first electrode of the driving transistor T1.

The sixth transistor T6 serves to transfer the light emitting current output from the driving transistor T1 to the light emitting diode LED. The gate electrode of the sixth transistor T6 is connected to the light emitting control line 155, the first electrode of the sixth transistor T6 is connected to the second electrode of the driving transistor T1, and the second electrode of the sixth transistor T6 is connected to the anode of the light emitting diode LED.

The seventh transistor T7 is a p-type or n-type transistor, and the semiconductor layer has a silicon semiconductor or oxide semiconductor. The seventh transistor T7 serves for initializing the anode of the light emitting diode LED. The gate electrode of the seventh transistor T7 is connected to the first scan line 151, the first electrode of the seventh transistor T7 is connected to the anode of light emitting diode LED, and the second electrode of the seventh transistor T7 is connected to the second initialization voltage line 128. When the seventh transistor T7 is turned on by the negative voltage of the first scan line 151, the second initialization voltage AVinit is applied to the anode of the light emitting diode LED to be initialized. On the other hand, the gate electrode of the seventh transistor T7 may be connected to a separate bypass control line and may be controlled by the first scan line 151 and separate wiring. In addition, according to an embodiment, the second initialization voltage line 128 to which the second initialization voltage AVinit is applied may be the same as the first initialization voltage line 127 to which the first initialization voltage Vinit is applied.

It is described that one pixel PX includes the seven transistors T1 to T7, two capacitors (the storage capacitor Cst, the boost capacitor $C_{boost}$), however it is not limited thereto, and according to an embodiment, the boost capacitor $C_{boost}$ may be omitted. Also, even in an embodiment in which the third transistor and the fourth transistor are formed of an n-type transistor, only one of them may be formed as an n-type transistor or the other transistor may be formed as an n-type transistor.

In the above, the circuit structure of the pixel formed in the display area DA was described with reference to FIG. 28.

A reflection adjusting layer may be disposed on the light blocking layer. The reflection adjusting layer may selectively absorb light of a wavelength of a partial band among light reflected inside the display device or light incident outside the display device. The reflection adjusting layer may fill the opening OP.

For example, the reflection adjusting layer absorbs a first wavelength region of 490 nm to 505 nm and a second wavelength region of 585 nm to 600 nm, and thus light transmittance in the first wavelength region and second wavelength region may be 40% or less. The reflection adjusting layer may absorb light of a wavelength outside the emission wavelength range of red, green, or blue emitted from the light emitting diode ED. As described, the reflection adjusting layer absorbs light of a wavelength that does not belong to a wavelength range of red, green, or blue emitted from the light emitting diode, thereby preventing or minimizing the reduction in luminance of the display device and simultaneously preventing or minimizing the deterioration of the luminous efficiency and improving visibility of the display device.

In the embodiment, the reflection adjusting layer may be provided as an organic material layer including a dye, a pigment, or combination thereof. The reflection adjusting layer may contain a tetraazaporphyrin (TAP)-based compound, a porphyrin-based compound, a metal porphyrin-based compound, an oxazine-based compound, and a squarylium-based compound, a triarylmethane compound, a polymethine compound, an anthraquinone compound, a phthalocyanine compound, an azo compound, a perylene compound, a xanthene-based compound, a diammonium-based compound, a dipyrromethene-based compound, a cyanine-based compound, and a combination thereof.

In the embodiment, the reflection adjusting layer may have transmittance of about 64% to 72%. The transmittance of the reflection adjusting layer may be adjusted according to the content of the pigment and/or dye included in the reflection adjusting layer.

According to embodiments, the reflection adjusting layer may not be disposed in the component area DA2. In addition, an embodiment including the reflection adjusting layer may further include a capping layer and a low reflection layer disposed between the cathode (Cathode) and the encapsulation layer 400.

The capping layer may serve to improve the luminous efficiency of the light emitting diode ED by the principle of constructive interference. The capping layer may include, for example, a material having a refractive index of 1.6 or more for light having a wavelength of 589 nm.

The capping layer may be an organic capping layer including an organic material, an inorganic capping layer including an inorganic material, or a composite capping layer including an organic material and an inorganic material. For example, the capping layer may contain a carbocyclic compound, a heterocyclic compound, an amine group-containing compound, a porphine derivative, a phthalocyanine derivative, a naphthalocyanine derivative, an alkali metal complex, alkaline earth metal complexes, or any combination thereof. The carbocyclic compounds, the heterocyclic compounds, and the amine group-containing compounds may be optionally substituted with substituents including O, N, S, Se, Si, F, Cl, Br, I, or any combination thereof.

A low reflection layer may be disposed on the capping layer. The low reflective layer may overlap a front surface of the substrate 110.

The low reflective layer may include an inorganic material having low reflectance, and in an embodiment, it may include a metal or metal oxide. When the low reflective layer contains a metal, it may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), and it may include zinc (Zn), germanium (Ge), silver (Ag), magnesium (Mg), gold (Au), copper (Cu), calcium (Ca), or a combination thereof. In addition, when the low reflective layer contains a metal oxide, it may include, for example, $SiO_2$, $TiO_2$, $ZrO_2$, $Ta_2O_5$, $HfO_2$, $Al_2O_3$, $ZnO$, $Y_2O_3$, $BeO$, $MgO$, $PbO_2$, $WO_3$, $SiN_x$, $LiF$, $CaF_2$, $MgF_2$, $CdS$, or a combination thereof.

In the embodiment, an absorption coefficient (k) of the inorganic material included in the low reflective layer may be 4.0 or less and 0.5 or more ($0.5 \leq k \leq 4.0$). In addition, the inorganic material included in the low reflective layer may have a refractive index (n) of 1 or more ($n \geq 1.0$).

The low reflective layer induces destructive interference between the light incident into the display device and the light reflected from the metal disposed under the low reflective layer, thereby reducing reflection of external light. Accordingly, the display quality and visibility of the display device can be improved by reducing the reflection of the external light of the display device through the low reflective layer.

According to embodiments, the capping layer may not be formed, and then the low reflective layer may be contact the cathode (Cathode) directly.

The encapsulation layer is disposed on the low reflective layer, other structures may be the same as FIGS. 7 and 24.

While this disclosure has been described in connection with what is presently considered to be practical embodiments, it is to be understood that the disclosure is not limited to the disclosed embodiments. On the contrary, it is intended to cover various modifications and equivalent arrangements included within the spirit and scope of the appended claims.

What is claimed is:

1. A light emitting display device comprising:
a substrate;
an anode positioned on the substrate;
a black pixel defining layer, wherein an opening overlapping the anode is defined in the black pixel defining layer;
an emission layer positioned in the opening of the black pixel defining layer;
a spacer positioned on the black pixel defining layer and having a step, an entirety of the spacer being transparent; and
a cathode formed on the emission layer, the black pixel defining layer, and the spacer,
wherein the spacer has a first portion and a second portion having a lower height than the first portion and integrally formed with the first portion, and
one of end portions of the second portion is positioned closer to the opening than one of end portions of the first portion.

2. The light emitting display device of claim 1, wherein the second portion is positioned away from the opening of the black pixel defining layer by a predetermined distance.

3. The light emitting display device of claim 2, wherein a planar area ratio of the black pixel defining layer covered by the spacer is 50% or more and 95% or less.

4. The light emitting display device of claim 1, wherein the spacer is formed of a photosensitive polyimide (PSPI) or a positive type of photosensitive organic material, and
the black pixel defining layer includes a light blocking material and is formed of an organic material having a negative type of black color.

5. The light emitting display device of claim 1, wherein
a height of the first portion is 1.1 μm or more and 2.0 μm or less, and
a height of the second portion is 0.1 μm more and 0.5 μm or less.

6. The light emitting display device of claim 1, further comprising:
an encapsulation layer positioned on the cathode;
a detecting insulating layer and a detecting electrode positioned on the encapsulation layer; and
a light blocking layer and a color filter positioned on the detecting insulating layer and the detecting electrode.

7. The light emitting display device of claim 1, further comprising:
a functional layer disposed under the cathode and positioned on the black pixel defining layer, the emission layer, and the spacer,
the functional layer includes a hole injection layer, and
the hole injection layer is in contact with the black pixel defining layer and the spacer.

* * * * *